(12) United States Patent  
Nadeau-Dostie et al.

(10) Patent No.: US 8,516,317 B2  
(45) Date of Patent: Aug. 20, 2013

(54) METHODS FOR AT-SPEED TESTING OF MEMORY INTERFACE

(75) Inventors: Benoit Nadeau-Dostie, Gatineau (CA); Jean-François Côté, Gatineau (CA)

(73) Assignee: Mentor Graphics Corporation, Wilsonville, OR (US)

( * ) Notice: Subject to any disclaimer, the term of this patent is extended or adjusted under 35 U.S.C. 154(b) by 290 days.

(21) Appl. No.: 13/018,279

(22) Filed: Jan. 31, 2011

(65) Prior Publication Data

US 2012/0198294 A1 Aug. 2, 2012

(51) Int. Cl.  
*G01R 31/28* (2006.01)

(52) U.S. Cl.  
USPC .......................... 714/726; 714/733; 714/742

(58) Field of Classification Search  
USPC .......................................... 714/726, 733, 742  
See application file for complete search history.

(56) References Cited

U.S. PATENT DOCUMENTS

| | | | |
|---|---|---|---|
| 6,069,829 A * | 5/2000 | Komai et al. | 365/201 |
| 6,145,105 A | 11/2000 | Nadeau-Dostie | |
| 6,335,887 B1 * | 1/2002 | Aoki et al. | 365/201 |
| 7,155,651 B2 | 12/2006 | Nadeau-Dostie | |
| 7,194,669 B2 | 3/2007 | Nadeau-Dostie | |
| 7,240,256 B2 * | 7/2007 | Yamane | 714/723 |
| 7,499,356 B2 * | 3/2009 | Do | 365/201 |
| 7,546,497 B2 * | 6/2009 | Jang | 714/718 |
| 7,620,862 B1 * | 11/2009 | Lai | 714/725 |
| 7,861,128 B1 * | 12/2010 | Moore | 714/726 |

OTHER PUBLICATIONS

Hui and Nadeau-Dostie, "Scan Testing of Latch Arrays," IEEE VLSI Test Symposium 1992, 31-36.

* cited by examiner

*Primary Examiner* — Esaw Abraham

(57) ABSTRACT

Methods for at-speed testing of a memory interface associated with an embedded memory comprise two write operations in succession, two read operations in succession, and a capture operation using scan cells. The write and read operations are performed during a single clock burst, two separate clock bursts in a clock signal, or two separate clock bursts in separate clock signals.

31 Claims, 17 Drawing Sheets

METHODS FOR AT-SPEED TESTING OF MEMORY INTERFACE

RELATED APPLICATIONS

This application is a continuation-in-part of U.S. patent application Ser. No. 12/579,572filed on Oct. 15, 2009 (now abandoned), which is a continuation of U.S. patent application Ser. No. 11/439,497, filed on May 24, 2006, (now U.S. Pat. No. 7,617,425), which claimed priority under 35 U.S.C. §119 to U.S. Provisional Patent Application No. 60/693,778, filed on Jun. 27, 2005. Each of these applications is incorporated entirely herein by reference.

FIELD OF THE INVENTION

The present invention is directed to the testing of integrated circuits. Various aspects of the invention may be particularly useful for at-speed testing of memory interfaces.

BACKGROUND OF THE INVENTION

The main challenges facing semiconductor manufacturers and integrated circuit designers revolve around achieving the highest yield in the shortest amount of time. This is especially true as the industry continues to move to smaller process geometries and as circuit operating speeds continue to increase. There is therefore a need for products and test solutions that enable circuit designers to improve product quality, gain information on the source of product failures and field returns, and use that information to create higher yielding integrated circuits (ICs) faster. It is well known to test ICs using scan test techniques in which test data is scanned into an IC to stimulate the IC and IC response data is scanned out for analysis. One problem which has yet to be satisfactorily resolved is testing of a memory interface which includes a memory's test interface and surrounding functional logic that generate memory inputs and receive memory outputs.

FIGS. 1a and 1b illustrate a memory 12, surrounded by input and output logic circuitry 14, and 16, respectively. The memory includes memory cells, an address decoder, precharge logic, etc., which are not shown for simplicity. Input scannable memory elements 18, which form a test input scan chain, are provided for scanning test data into the circuit and output scannable memory elements 20, which form a test response output scan chain, are provided for capturing and scanning test responses output from the circuit. The input memory elements apply test patterns to the logic which, in turn, apply its outputs to the write enable control, address and data inputs of the memory 12. The data outputs of the memory are applied to the output logic on the output side of the memory. The output logic applies its output to the output scannable memory elements 20. The memory elements are arranged into scan chains by applying an active scan enable signal, SE, to respective inputs. An inactive scan enable signal is applied to the memory elements to launch test data or capture response data. As is well known in the art, the scannable memory elements include flip-flops for storing test and response data.

The bold lines in the figures represent a plurality of lines or connectors and corresponding scannable memory elements, the number of which depends on the number of memory write enable inputs, address inputs and data inputs and memory outputs of the circuit design.

For the purpose of simplifying the description, it is assumed herein that all flip-flops, and the memory are positive edge-triggered. In FIG. 1a, the memory is in phase with the surrounding logic so that it captures its input and updates its output on the rising edge of the clock. In FIG. 1b, the memory is out of phase with the surrounding logic because of clock inversion caused by inverter 22. The memory output is latched by transparent latch 24 so that the memory output appears to update its output on the positive edge before it is used by the output logic 16. The memory input is captured on the falling edge of the clock. As will be discussed in more detail below, test methods according to various embodiments of the present invention can be applied to both circuit configurations.

FIG. 2 illustrates a known memory circuit that includes a memory test interface or BIST collar 32 which surrounds memory 12, a memory BIST (Built-In Self-Test) circuit 34 and circuit modifications, described below, to the memory circuits of FIGS. 1a and 1b for performing at-speed scan testing of the memory interface. The surrounding functional logic includes logic 14a which outputs a write enable data, logic 14b which outputs an address and input data to be applied to the memory, and output logic 16 which receives data output by the memory. The test interface is indicated by the dotted line and includes test interface input multiplexers (muxes) 36, controlled by a BistOn select signal for selecting between functional inputs and BIST inputs. The input muxes include a write enable mux 38, a plurality of address input muxes 40 and a plurality of data input muxes 42.

A bypass mechanism 44 connects data inputs and corresponding data outputs through respective scannable flip-flops 46. Flip-flops 46 are clocked on the same edge of the clock, CK, which clocks the memory. The test interface 32 also includes a set of output muxes 48, controlled by a test mode signal, tm, which is active high during scan and BIST testing to select between a memory output and the output of a corresponding bypass flip-flop 46.

Scannable observation logic 50 and 52 are provided for the control (e.g. write enable) and address inputs, respectively, of the memory 12. This logic is in the form of scannable flip-flops that are clocked on the same edge as the memory. The bypass mechanism and the observation logic complement other features, such as memory BIST circuit 34, to test the memory 12 independently of a scan test.

A scan test is performed by deselecting the memory 12, setting BistOn low and tm high. Test data is scanned into the input scan chain 18 and applied to input logic 14a and 14b whose outputs are applied to the test interface input muxes 36. The outputs of input muxes 38 and 40 are captured in observation logic 50 and 52 and the outputs of data input muxes 42 are captured in bypass flip-flops 46. The outputs of bypass flip-flops 46 are applied to inputs of output muxes 48, the outputs of which are applied to output logic 16 whose outputs are captured by the output scan chain. The captured data is scanned out for analysis.

An interface input timing test is performed by launching test data from the input scan chain 18 and capturing data in the observation memory elements 50 and 52 and bypass flip-flops 46. The captured data is scanned out for analysis. An output timing test involves launching data from bypass flip-flops 46 and capturing the resulting data in output scan chain 20. The captured data is scanned out and analyzed.

These observation and bypass mechanisms allow for testing the timing of the input side relatively accurately because the setup time for a synchronous configuration is similar to that of a flip-flop. However, the test of the output side of the memory is less accurate because the bypass flip-flops 46 update their output significantly faster than the memory 12. As a result, subtle delay faults can escape detection by a combination of a scan test and a memory BIST test even though both tests are performed at-speed. Another limitation is that the bypass mechanism can be relatively expensive in terms of silicon area for wide data buses. Further, because of their potential impact on timing, it would also be desirable to eliminate the set of output muxes 48 at the output of the memory.

BRIEF SUMMARY OF THE INVENTION

Aspects of the invention relate to at-speed testing memory interfaces. In various embodiments of the present invention, two data words are written to and read from two memory locations in fast succession to cause a memory (including memory cells, address decoder (partial), precharge logic, etc.) and surrounding logic to be tested at speed. The testing process is referred to as a "write-thru" process as the memory acts as a pipeline connecting the input functional logic and the output functional logic. The write and read operations may be performed during a single clock burst, two separate clock bursts in a clock signal, or separate clock bursts in separate clock signals.

Performing the write and read operations in separate clock bursts allows for reduction of the number of at-speed clock cycles in a clock burst and thus reduction of the power supply fluctuations. Only a certain number of clock cycles in a clock burst need to be at the functional speed and the rest of the clock cycles can be slowed down.

Performing the write and read operations in separate clock bursts also enables testing of multi-port memories with asynchronous clocks. Separate read and write sequencers may be employed to ensure that the write test address is applied synchronously to the write address input of the memory and that the read test address is applied synchronously to the read address input of the memory. For memories with multiple asynchronous write ports, decode logic circuitry may be employed to prevent writing data to the same memory address from different write ports. A capture disable signal may be used and made active if the memory output is unknown. The sequence of the read operations may be modified to eliminate the need for a memory BIST circuit for small memories. If a memory has a write-all input allowing writing a data word to all memory locations in a single operation, test-dedicated circuitry may be reduced or eliminated and modified test methods may be used.

DETAILED DESCRIPTION OF THE INVENTION

Figure 1A:
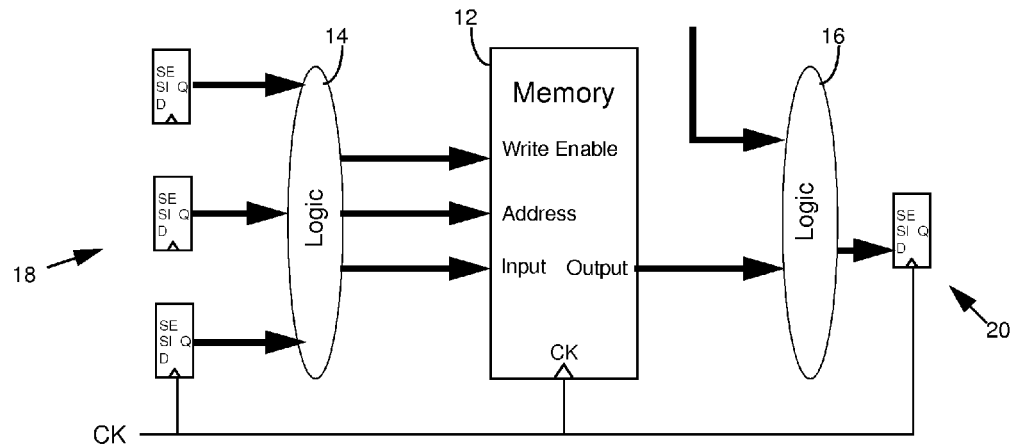
FIG. 1*a* illustrates a memory circuit which is in-phase with surrounding logic so that it captures its input and updates its output on the rising edge of the clock. (Prior Art).
Figure 1B:
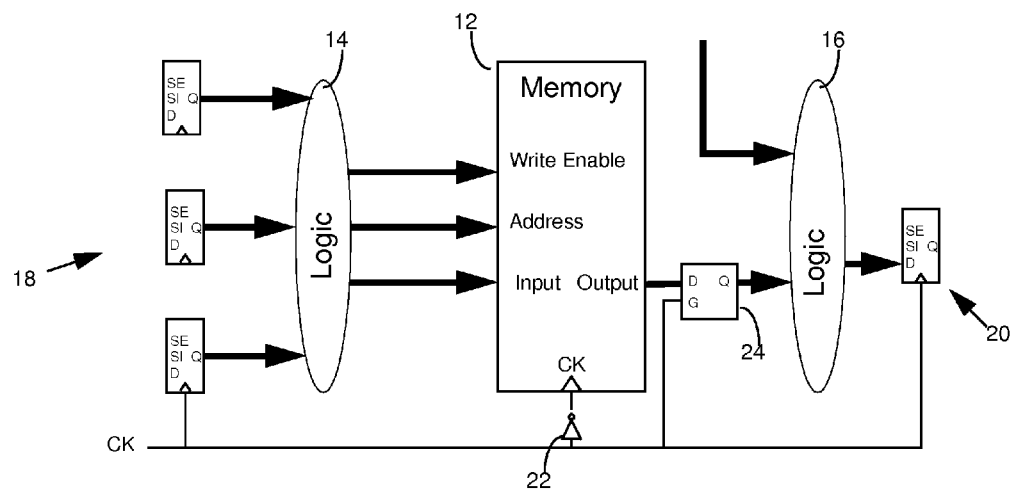
FIG. 1*b* illustrates a memory circuit in which is out-of-phase with surrounding logic so that it captures its input and updates its output on the falling edge of the clock. (Prior Art).

In the following detailed description, numerous specific details are set forth in order to provide a thorough understanding of the present invention. However, it will be understood by those skilled in the art that the present invention may be practiced without these specific details. In other instances, well known methods, procedures, components and circuits have not been described in detail so as not to obscure aspects of the present invention.

In various embodiments of the present invention, two data words are written to and read from two memory locations in fast succession, to cause the memory circuitry (including memory cells, address decoder (partial), precharge logic, etc.) and surrounding logic to be tested at speed. The testing process is referred to herein as a "write-thru" process, as the memory acts as a pipeline connecting the input function logic and the output functional logic. A write-thru process according to various embodiments of the invention is illustrated in the flow diagram of FIG. 3 and comprises the following operations:

First, an initialization address and data word are launched (operation 60);

Second, the initialization data word is written to the initialization address and a final data word is launched (operation 62);

Third, the final data word is written to a second or final address (operation 64); the final address may be derived from the initialization address and obtained by flipping at least one bit of the initialization address;

Fourth, the initialization data word is read from the initialization address (operation 66);

Fifth, the final data word is read from the final address (operation 68);

Sixth, the outputs of surrounding logic is captured (operation 70); and

Seventh, the captured data is analyzed to determine whether it corresponds to expected data (operation 72).

Although the above write-thru process is described with seven operations and in a particular sequential order, it should be understood that there are numerous variations and permutations of these operations that may be implemented according to various embodiments of the invention.

I. Methods Using a Single Clock Burst for Write and Read Operations

Figure 4:
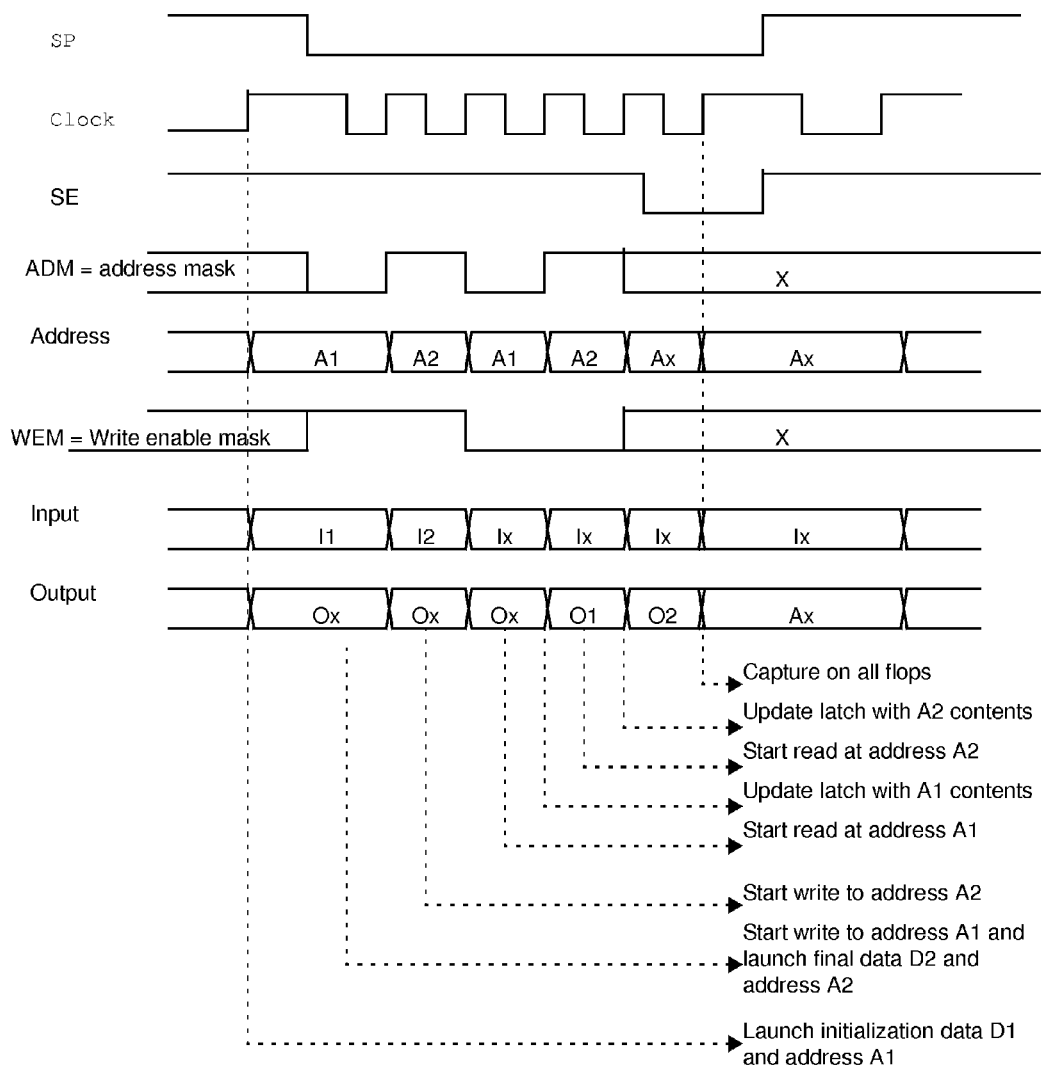
FIG. 4 is a timing diagram illustrating signal waveforms according to an embodiment in which memory is out-of-phase with surrounding logic.
Figure 5:
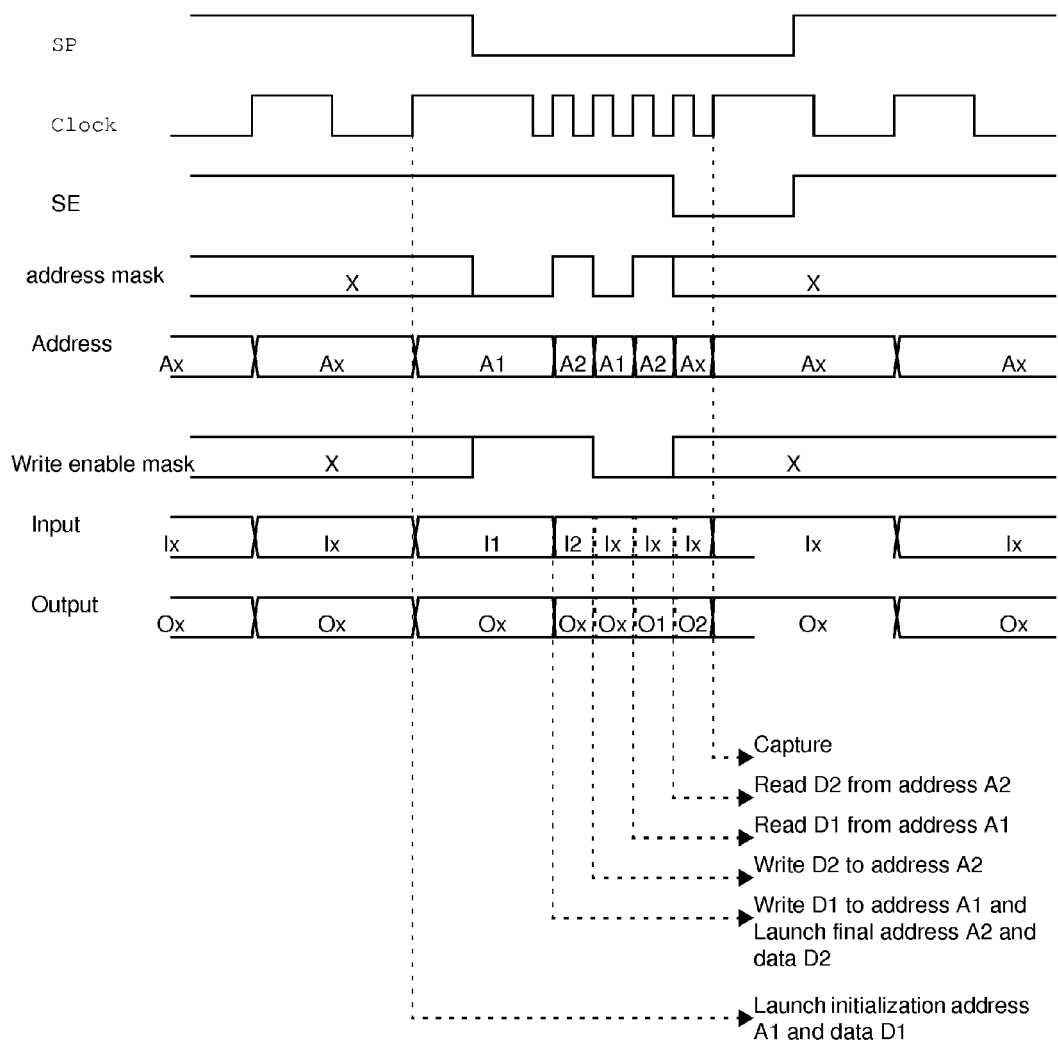
FIG. 5 is a timing diagram illustrating signal waveforms according to an embodiment in which memory is in-phase with surrounding logic.

Some embodiments of the invention employ a single clock burst for the write-thru process. Two examples of the corresponding waveforms are illustrated in FIGS. 4 and 5. FIG. 4 shows waveforms for a memory which is out-of-phase with surrounding logic (time borrowing) while FIG. 5 shows waveforms for a memory which is in-phase with surrounding logic. The timing shown in the various figures is based on a scan test method described in U.S. Pat. No. 7,194,669, entitled "Method And Circuit For At-Speed Testing Of Scan Circuits," issued on Mar. 20, 2007 and naming Benoit Nadeau-Dostie as invention, which patent is incorporated herein by reference. The scan test methods described in U.S. Pat. No. 7,194,669 are primarily for testing a circuit having memory elements arranged into one or more scan chains. The methods employ a shift phase for serially loading test patterns into the scan chains and serially unloading test response patterns from the scan chains and a capture phase for capturing the response of the circuit to the test pattern. During the capture phase, the serial output of a scan chain is connected to its respective serial input, and a predetermined number of clock cycles are applied with the memory elements in the scan chain being configured in a non-capture mode for all but the last clock cycle of the capture phase. During the last clock cycle of the capture phase, the memory elements in the scan chain are configured in a capture mode. With various embodiments of the present invention, the last two clock cycles are applied at the rated or system speed to perform the last read access and capture of the result of the read operation in the flip-flops. However, it will be understood by those skilled in the art that other scan test methods can be used with various implementations of the present invention.

In FIGS. 4 and 5, the waveform labeled SP is a test phase control signal which defines a shift phase (high) and a capture phase (low). The waveform labeled Clock is the clock signal (CK in FIG. 2) for the circuit and memory. The waveform labeled SE is a scan enable signal which configures scannable memory elements in a shift mode (high) or a capture mode (low). Scannable memory elements are configured in the shift phase when test data is shifted into scan chains and when test response data is shifted out of the scan chains. The waveform labeled ADM is an address mask control signal which controls the address applied to address inputs of the memory. The waveform labeled Address is the address signal applied to the address inputs of the memory. As can be seen, the figures show two addresses: A1 and A2. The waveform labeled WEM is a write enable mask signal which controls the write enable signal applied to the memory. WEM is first maintained high to write to the two memory locations in succession and then changed to low to read from the two memory locations in succession in the same order in which the addresses were written to the memory locations. The waveforms labeled Input and Output are the input and output signals at inputs and outputs, respectively, of the memory.

The above described sequence of operations yields a repeatable timing test that allows the calculation of transition fault coverage of the circuit in a conventional manner for a scan testable circuit. By writing to and reading from two memory locations in fast succession, the memory circuitry (memory cells, address decoder (partial), precharge logic, etc.) as well as the surrounding logic will be tested at speed. A single write/read operation would not yield a proper transition of the memory output for a memory that updates its output on a write operation and would thereby invalidate an at-speed test.

In the following description, memories are assumed to be synchronous memories operating either in-phase or out-of-phase with surrounding logic. While the specific embodiments illustrated show only out-of-phase configurations, it should be appreciated that various methods according to embodiments of the invention are easily applicable to in-phase configurations. For out-of-phase configurations, memory access starts on the falling edge of the clock and an update latch is used to stretch the access cycle (time borrowing). The methods and techniques described in aforementioned U.S. Pat. No. 7,194,669 may be used because they allow for the use of longer burst lengths to achieve higher at-speed coverage of the memory input. However, it will be understood that other scan methods with shorter burst lengths (down to two clock cycles) alternately or additionally can be used. Memories are also assumed to have single port and their address range can be incomplete as discussed later in a discussion of handling of incomplete address space and multi-port memories.

With various implementations of the invention, the exact timing of memory output timing, i.e., from the start of the read operation to data capture, may be tested. High coverage may be achieved as many address and data inputs are applied at-speed through the memory. Further, it does not matter whether memories update or do not update their outputs during a write operation.

Figure 7:
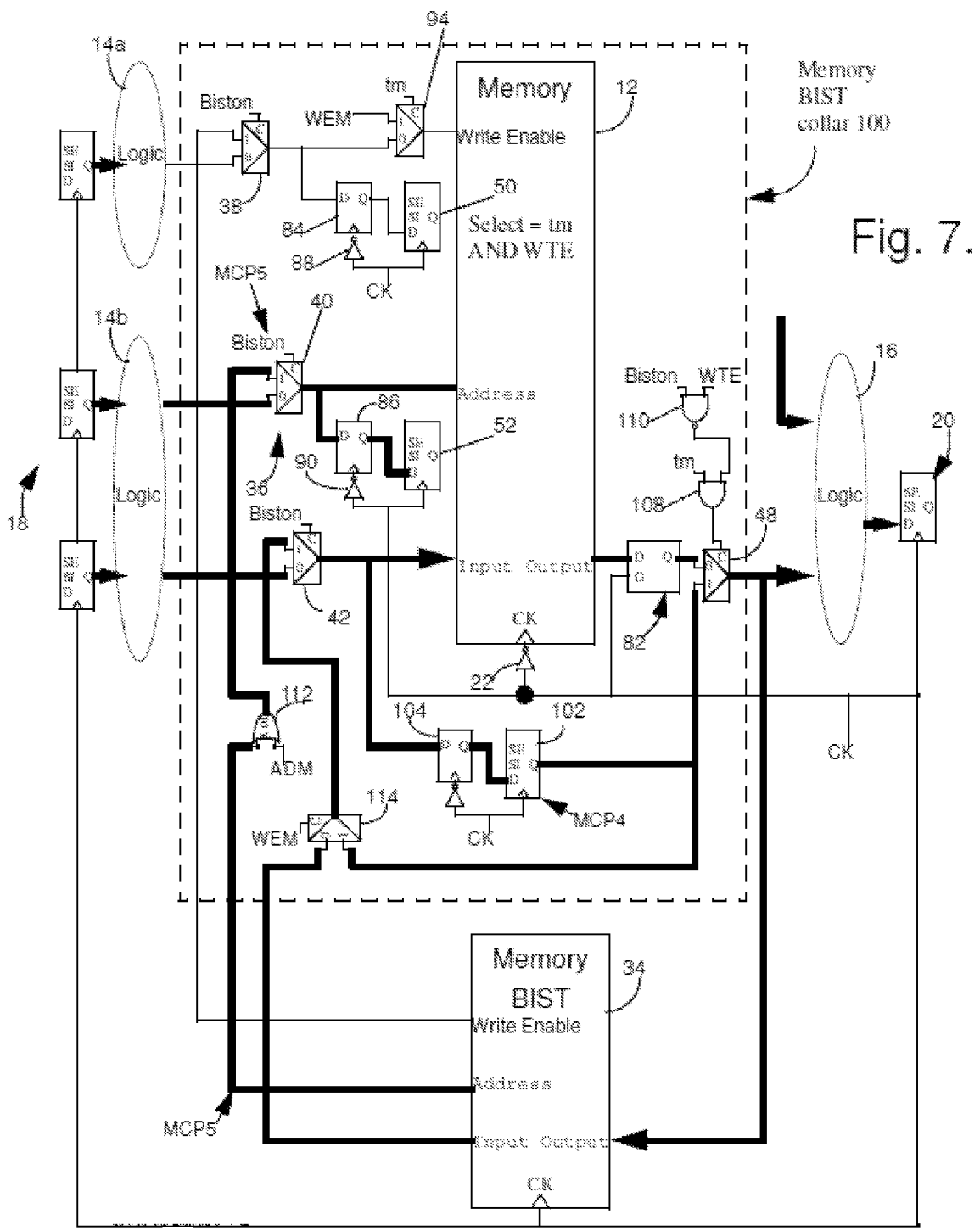
FIG. 7 is circuit diagram of a test interface according to second embodiment of the present invention.
Figure 8:
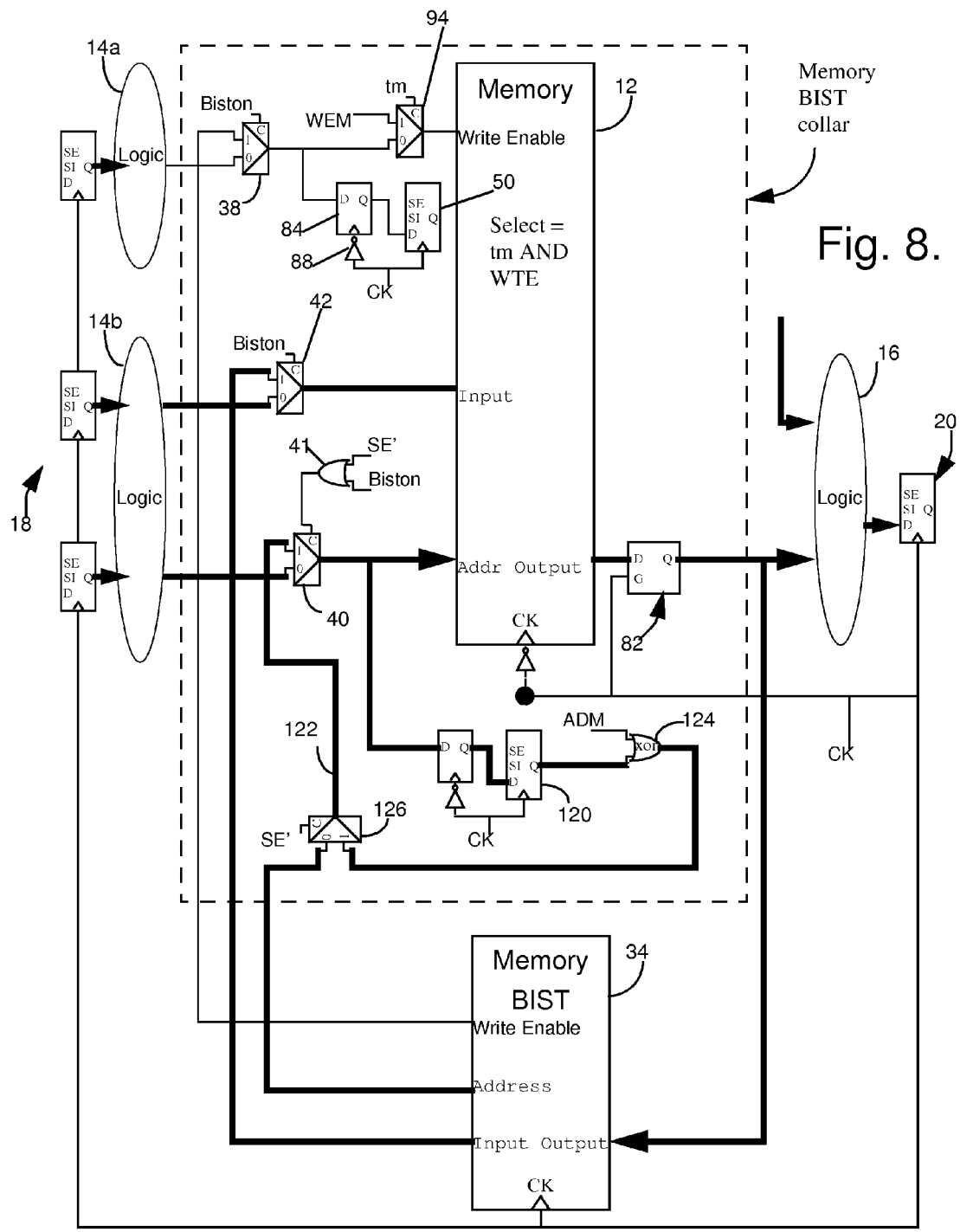
FIG. 8 is circuit diagram of a test interface according to a third embodiment of the present invention.

Various implementations of the present invention provide different test interface embodiments for carrying out the methods of memory interface testing in order to address the following specific situations: a first situation in which changes to functional circuits are permitted (FIG. 6); a second situation in which no changes to functional circuits are permitted (FIG. 7); and a third situation in which no functional circuit modification and no memory bypass are permitted (FIG. 8).

Ia. Functional Circuit Modifications Permitted

Figure 6:
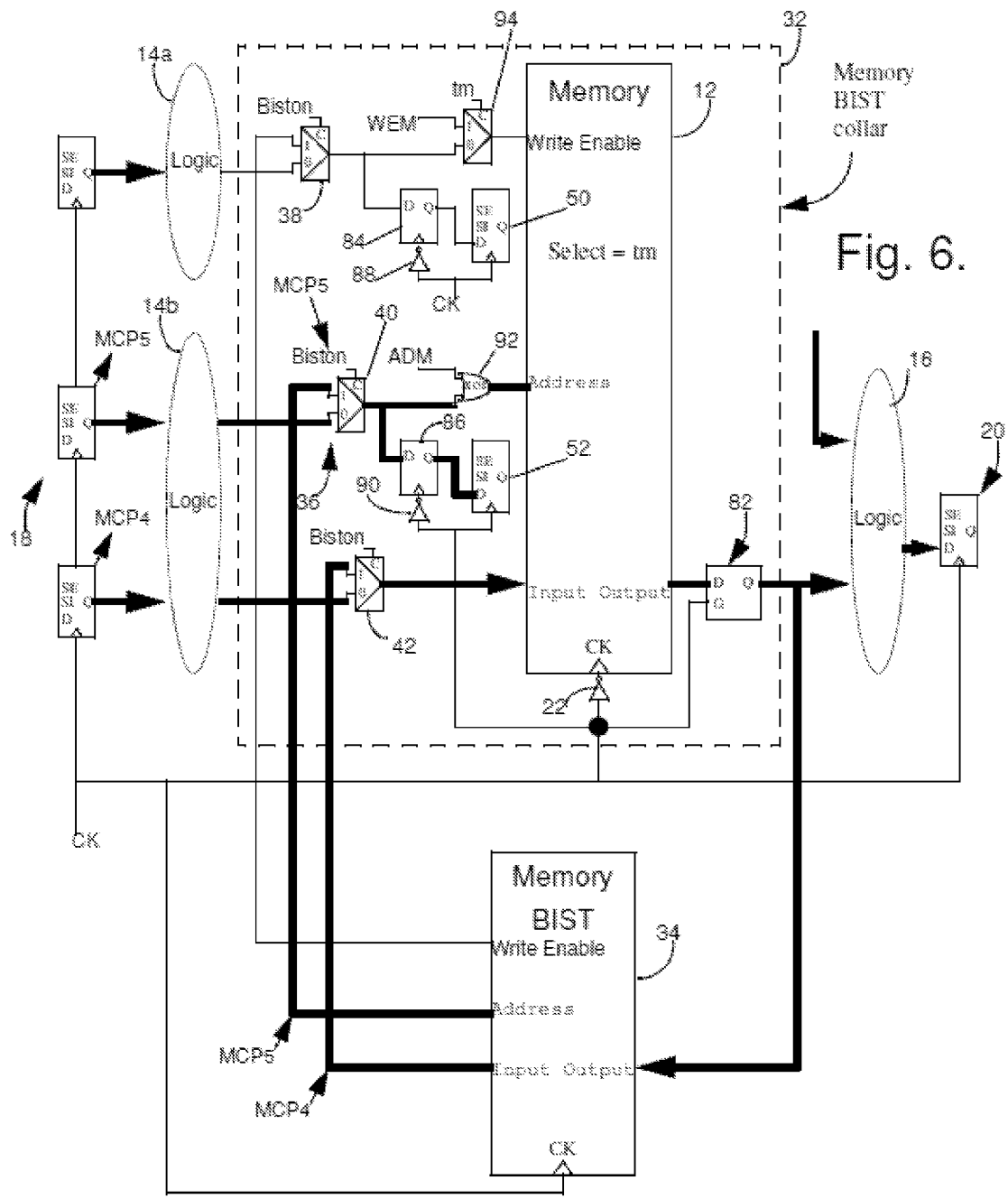
FIG. 6 is circuit diagram of a test interface according to a first embodiment of the present invention.

FIG. 6 illustrates a first embodiment of a test interface for use in a circuit in which functional circuit modifications are permitted. The figure shows a circuit with an out-of-phase circuit configuration which includes an inverter 22 applied to the memory clock input and a transparent latch 82 for each memory output. The output of the transparent latches are applied to the output logic 16 and to inputs labeled "output" of memory BIST circuit 34. As in FIG. 2, each of the outputs of output logic 16 is applied to the data input of a corresponding scannable memory elements 20 of the output scan chain.

Retiming memory elements 84 and 86 are connected to the outputs of the test interface input muxes 38 and 40 associated with the write enable input and address inputs, respectively, of the memory and observation logic 50 and 52 provided for the write enable and address inputs of the memory. The clock inputs of latches 84 and 86 are inverted by inverters 88 and 90. Retiming memory elements 84 and 86 as well as inverters 88 and 90 are not needed when the memory is in-phase.

Figure 2:
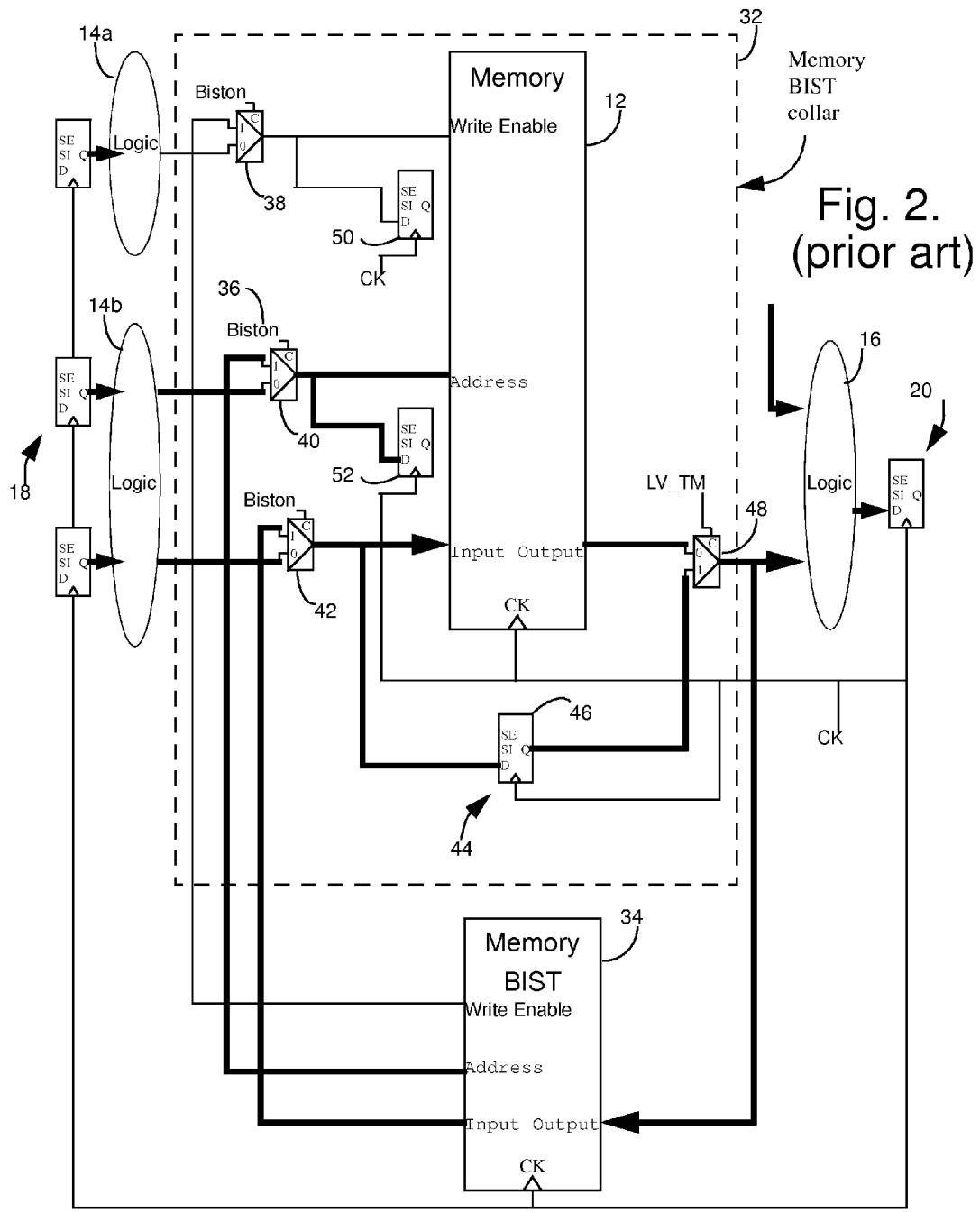
FIG. 2 illustrates a known memory circuit having a test interface or collar, BIST controller and circuitry to allow memory BIST testing of the memory and scan testing of input and output testing of the test interface and surrounding logic. (Prior Art).

Bypass flip-flops 46 of FIG. 2 are eliminated. The memory output is connected directly to the data input of the transparent latch 82.

An XOR gate 92 is inserted between one or more memory address input ports of the memory 12 and a corresponding test interface address input mux 40 and serves to derive a final address from an initialization address. The XOR gate 92 receives an address mask signal, Adm, and the output of a corresponding test interface address input mux 40. As previously mentioned, for input and output timing tests, Adm is a square wave to cause data to be written to two memory locations in succession and then read from the same two memory locations in succession.

The write enable input of the memory 12 is connected to the output of a second write enable selector 94 controlled by a test mode signal, tm, which is set high during scan testing and interface timing testing. This selector has a first input connected to a write enable mask (WEM) input and a second input connected to the output of test interface write enable input selector 38. During a timing test, WEM is set high to allow for writing to two memory locations in sequence and then set low to allow for reading from the same two memory locations in sequence.

The output of the test interface write enable input selector 38 is also applied to the input of a retiming memory element whose output is applied to an observation scannable memory element 50.

In the illustrated embodiment, address test data is launched from an input scannable memory element 18 and a test data input is launched from a corresponding input scannable memory element 18 after the launch of the address data. All flip-flops in the fanin of the memory address input must hold their value for five clock cycles (MCP5) and all flip-flops in the fanin of data inputs must hold their value for four clock cycles (MCP4) for both functional and BIST memory elements. The former keeps the initialization address, A1, constant, throughout the write-thru process. The latter allows for the application of two input data values: initialization data and final data.

With the embodiment illustrated in FIG. 6, the techniques described in U.S. Pat. No. 6,145,105, entitled "Method And Apparatus For Scan Testing Digital Circuits," issued Nov. 7, 2000, and naming Benoit Nadeau-Dostie at al. as invention, which patent is incorporated entirely herein by reference, may be used to maintain the address stable for five clock cycles and the data stable for four clock cycles before the capture operation so that the circuit only depends on flip-flop outputs which have completed their shift phase and can therefore be modeled as a combinational circuit.

BistOn can be assigned both active and inactive values and the applied value is kept constant during the burst of clock cycles of the capture phase When BistOn is active, the BIST outputs are selected at the test interface mux inputs. When BistOn is inactive, the functional inputs are selected.

Various embodiments of the invention may be particularly beneficial when a local address and data bus are used, i.e., when there is no fanout to other parts of the circuit other than to the memory. Note that an FSM has implicit fanout.

Advantageously, various embodiments of the invention are capable of testing the exact timing of both memory data input and output; eliminating the bypass logic, thus resulting in significant area savings, and eliminating the output mux in the functional path, and having potential application to register files (which, as will be appreciated by those of ordinary skill in the art, may require an observable address decoder).

With various embodiments of the invention, however, there may be a need to change the functional source of address and data to MCP5 and MCP4 flip-flops, respectively. This implies a) loss of at-speed coverage if a source that fans out to parts of the circuit other than the memory; b) that these embodiments are not applicable to circuits where the source of address and/or data is the memory itself; and c) that these embodiments can introduce redundant faults or asynchronous loops because the path through the memory is modeled as a direct connection from input to output during analysis, at least one address bit has an extra gate (XOR gate) on its functional path to the memory, and the combinational depth of the circuit; the memory is modeled as a direct connection from input to output and the depth of the circuit is the sum of the depth of the logic connected to the data input and the depth of the logic connected to the data output. Fault coverage might be reduced and ATPG complexity increased.

Ib. No Functional Circuit Modifications Permitted

FIG. 7 illustrates a test interface 100 for use when functional circuit modifications are not permitted. Again, the figure shows a circuit with an out-of-phase circuit configuration which includes an inverter 22 applied to the memory clock input and a transparent latch 82 for each memory output, as well as retiming memory elements 84, 86 and 104 and inverters 88 and 90, all of which are not needed for in-phase configuration. In this embodiment, all changes are confined to the memory BIST collar 100 and BIST controller 34. Memory write-thru is enabled only when BistOn is active (Logic 1). Data used for write-thru is sourced by data bypass flip-flops 102 which are MCP4. Address data used for write-thru is sourced by MCP5 flip-flops (not shown) in the memory BIST controller or in the collar if a local address counter is used. The BistOn signal is randomly selected and is an MCP5 source. The write-thru mode is enabled/disabled by a Test Access Port (TAP) instruction register or data register bit (not shown) called Write-Thru Enable, and labeled WTE in FIG. 7, for diagnostic purposes.

As can be seen in FIG. 7, a write enable input selector 94 is provided with inputs connected to the output of a write enable test interface input selector 38 and to a write enable mask (WEM) signal. The output of the test controller data input selector 42 is connected to the memory 12 and to the input of bypass scannable flip-flop 102 through a retiming memory element 104. The output of flip-flop 102 is applied to one input of an output selector 48. The output selector 48 is controlled by an AND gate 108. The inputs of the AND gate 108 are the test mode signal, tm, and the output of a NAND gate 110. The inputs of the NAND gate are BistOn and the aforementioned WTE signal. When tm is inactive (Logic 0), the output of the memory is always selected because the circuit is in functional mode.

The address output of the BIST controller is applied to one input of an XOR gate 112 whose other input is the address mask signal, Adm. The data output of the BIST controller is applied to one input of a selector 114 controlled by the write enable mask, WEM. The other input of the input selector is the output of the bypass flip-flop 102.

When BistOn is active, the functional input logic is not tested. BistOn selects the BIST address/data at the test interface inputs and selects the memory output to test the output logic. A "write-thru" operation is performed. However, when BistOn is inactive, the functional input logic is tested by capturing the functional address and data using the observation and bypass flip-flops respectively. On the output side, the output of the bypass register is selected to test the output logic (both functional and BIST).

Advantageously, these embodiments of the invention typically do not require functional changes to the memory circuit. This has several implications. First, there is no need to reduce at-speed coverage of other destinations. Second, it is applicable to more circuits (e.g., where the data and/or address is provided by another memory). Third, there is no introduction of asynchronous loops or redundant faults. Fourth, it has reduced combinational depth; the memory output is directly controllable from a set of dedicated registers and limit the combinational depth of the circuit as compared to the embodiment of FIG. 6 and there are no combinational paths that traverse the memory. Fifth, there is no need to modify the BIST controller itself except for the address counter in the illustrated examples. This requirement can be relaxed by using the address observation flip-flops to provide the address. This is discussed in more detail in the description of the third embodiment below. Sixth, this embodiment allows running with or without write-thru enabled and the signature is the same in both cases. This may be useful, e.g., for diagnosing problems occurring when the memory is involved in the at-speed scan test.

As will be appreciated by those of ordinary skill in the art, with these embodiments of the invention the timing of functional inputs is not exactly the same as in the functional mode. The difference is primarily from the difference in setup time of the observation and bypass flip-flops compared to the memory input. However, this is usually relatively small. Further, there is a need to employ bypass registers. This is expensive, especially when re-timing is needed for a memory running out-of-phase with the circuit, as in the illustrated embodiment. There is a need for a bypass multiplexer in the functional path at the output of the memory.

Figure 9:
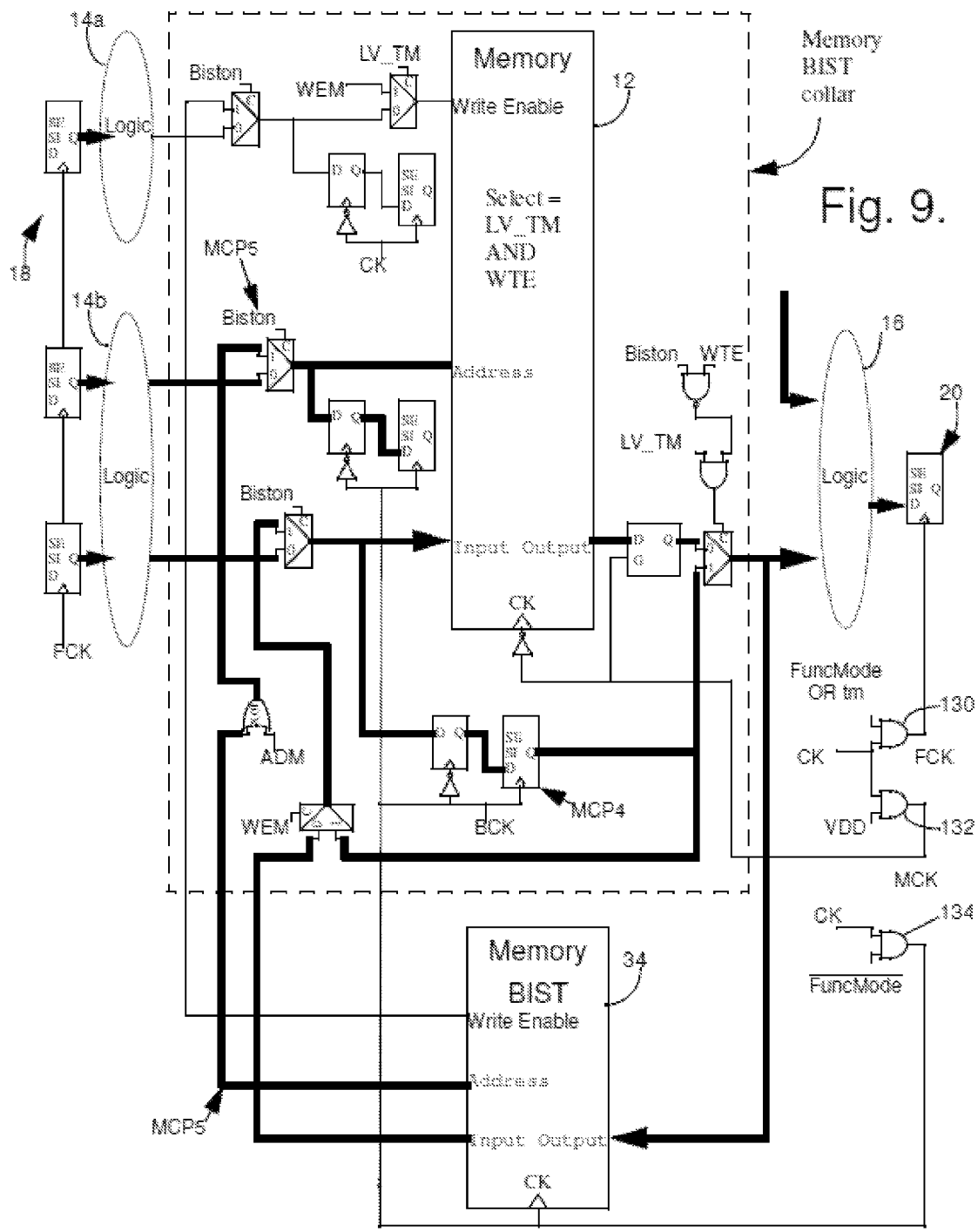
FIG. 9 is circuit diagram of a test interface, similar to that of FIG. 7, according to still another embodiment of the present invention.

FIG. 9 illustrates a modification to the embodiment of FIG. 7, which will be described in more detail below. This embodiment may be useful, e.g., when the memory BIST circuit must operate from a different clock branch from that of the memory so that the clock can be gated off during functional operation.

Ic. No Functional Modification and No Memory Bypass Permitted

In the embodiment illustrated in FIG. 6, the methods and techniques described in U.S. Pat. No. 6,145,105 (incorporated entirely herein by reference above) may be used to maintain the address stable for five cycles and data stable for four cycles before the capture operation so that the circuit only depends on flip-flop outputs which have completed their shift phase and can therefore be modeled as a combinational circuit. As illustrated in FIG. 8, this requirement can be relaxed in two ways.

First, the requirement to hold the flip-flops which generate the address can be relaxed by using address observation flip-flops 120 to take a snapshot of the memory BIST address at the same time as operation 62 (write to the first memory address and launch of the final address) of the sequence. This step is labeled "Start write to address A1 and launch final data D2 and address A2" in FIG. 4. Then, a path 122 is created from the observation flops 120 to the memory address input, via XOR gate 124, selector 126 a modified version of scan enable, SE', and test interface selector 40, controlled by the output of OR gate 41 having inputs SE' and BistOn, to apply the stored address A1 in subsequent step 4 (read of the final address) or the modified address A2 during steps 3 and 5. Signal SE' is identical to SE except that it is forced low for one clock cycle to capture initialization address A1 generated by the functional logic or the memory BIST circuit. During the last clock cycle, the observation flip-flops perform a capture, like all other flip-flops, and thereby capture the address applied to the memory. The process of taking the address snapshot and holding the value until the capture step is totally transparent to analysis tools. For that reason, the value of the address at which the snapshot is taken is not important. This feature can be used in the context of all embodiments proposed herein.

Second, the requirement to hold the flip-flops in the BIST controller, which generate the data input, requires analysis tools to calculate the value of the data input before the test pattern is completely shifted into the flip-flops. This data value is used during step 2 (initialization) and step 3 (final) of the sequence. Analysis tools already perform this type of operation when calculating transition fault coverage. Since the memory behaves like a pipeline of depth 3 that is clocked while data is scanned in, the initialization and final values are simply derived from a shifted version of the scan chain contents. This operation only needs to be performed locally on the portion of the circuit which generates the data input of the memory.

This embodiment has all of the advantages of the first embodiment described earlier and eliminates the data input-output bypass logic, thereby saving area and eliminating a multiplexer on memory output functional paths. There is no need to modify the memory BIST controller. There is no need to modify the functional logic and there is no impact on at-speed fault coverage of flip-flops that fan out to logic other than memory.

The trade-offs of this embodiment are that first, there are some cases in which the method is not applicable similar to the embodiment described in FIG. 6; second, the embodiment is not applicable to circuits where the source of address and/or data is a memory itself; third, the embodiment can introduce redundant faults or even loops because the path through the memory goes through pipeline stages whose value cannot be set independently; and fourth, the combinational depth is the same as in the first embodiment.

Id. Low Power Option

It is sometimes desirable to provide modes where either the functional logic or memory BIST logic needs to cease all operations to reduce power consumption or reduce the number of simulation events. To do so, gates can be added to create balanced branches of the clock distribution tree so that synchronous operation between branches is preserved. FIG. 9 illustrates the embodiment of FIG. 7 which provides AND gates 130, 132 and 134 for providing these modes and for enabling balanced branches and disabling others under different conditions.

AND gate 130 receives a functional signal, FuncMode input, or test mode signal, tm at one input and a clock signal, CK, at its other input and outputs a functional clock signal, FCK, branch. AND gate 132 receives clock signal, CK, at one input and V.sub.DD at its other input to produce a memory clock signal branch, MCK. AND gate 134 is connected to clock input, CK, and an inverted functional mode input to generate a BIST clock signal branch.

II. Methods Using Different Clock Bursts for Write and Read Operations

Figure 11:
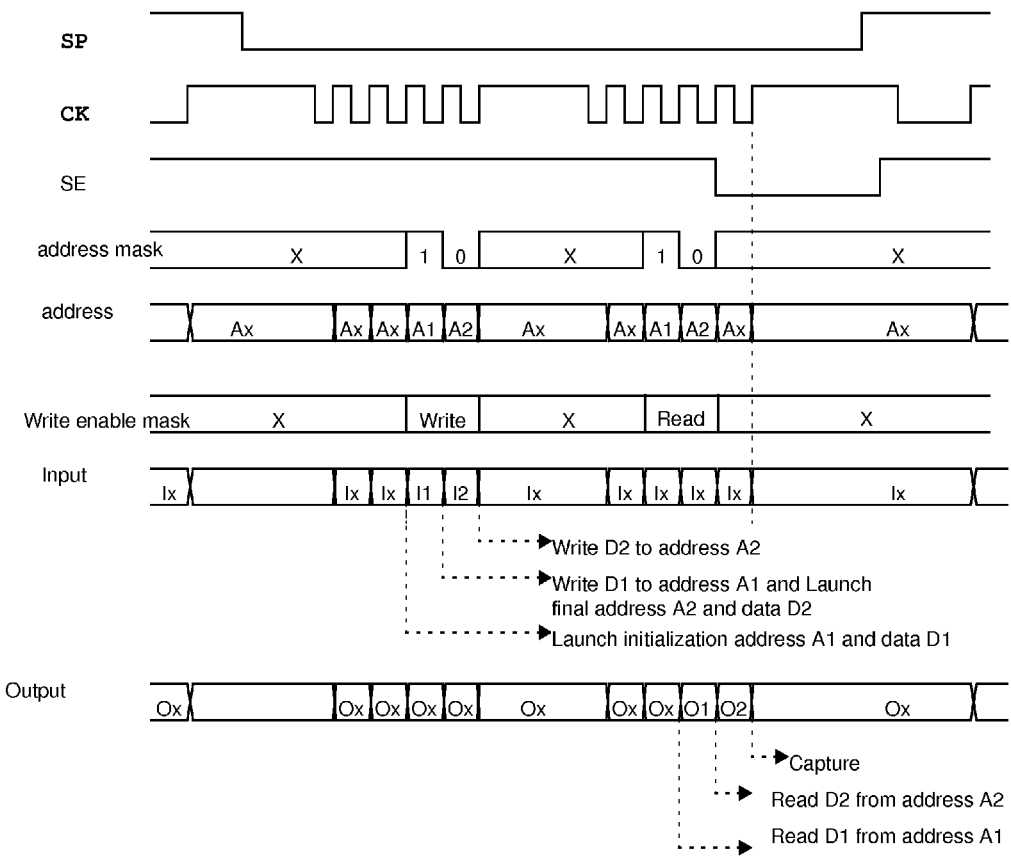
FIG. 11 is a timing diagram illustrating signal waveforms according to various embodiments in which the write and read operations are performed in different clock bursts.

Section I discusses some embodiments of the invention that employ a single clock burst for both the write and read operations. The present section will discuss some other embodiments of the invention that perform the write and read operations in separate clock bursts. FIG. 11 illustrates a write-thru process that is performed during two clock bursts according to various implementations of the invention. The process comprises:

First, data is loaded in scannable flip-flops. This is occurring during the shift phase indicated by a value of 1 of the SP control signal. The clock frequency used during the shift phase is arbitrary and is typically lower than the one used during the normal mode of operation of the circuit. Clock CK is stopped and control signal SP is set to 0 at the end of the shift phase. Typically, there is a pause allowing switching the clock source for clock CK.

Second, a first clock burst is generated to perform write operations. The clock frequency used during this write clock burst is substantially the same as the one used during the normal mode of operation of the circuit. During this write clock burst, the following operations are performed:

a. Launch initialization address A1 and data word D1 from flip-flops in the fan-in of the memory.
    b. Write initialization data word D1 at memory address A1 and, launch final data word D2 and final address A2.
    c. Write final data word D2 at memory address A2.

Third, a second clock burst is generated to perform read operations. Again here, the clock frequency used during this read clock burst is substantially the same as the one used during the normal mode of operation of the circuit. During this read clock burst, the following steps are performed:

d. Read initialization data word D1 at memory address A1.
    e. Read final data word D2 at memory address A2.
    f. Perform capture operation on scannable flip-flops.

Fourth, scan out the values captured by the scannable flip-flops. Control signal SP is first set to 1 at the beginning of the shift phase. Again here, the clock frequency used during the shift phase is arbitrary and is usually lower than the one used during the normal mode of operation of the circuit.

Many other events may occur during the first and second burst but they are not important. For example, the memory address used for the first three clock cycles of the write clock burst are not important and are labeled Ax. Similarly, the corresponding memory data inputs are disregarded and labeled Ax. Memory data output values labeled Ox are disregarded as well. The address mask and write enable mask can take any value during the cycles where they are identified as "X".

It should be appreciated that while five consecutive clock pulses are shown in each of the two clock bursts in FIG. 11, the write and read clock bursts may include an arbitrary number of clock pulses (or cycles).

FIG. 11 shows waveforms for a memory that is in-phase with surrounding logic. Examples in Section II all use in-phase configurations, in contrast to those in Section I. This should not be treated as a preference or a limitation. The methods of using different clock bursts are also applicable to testing memories operating out-of-phase with surrounding logic. Circuit modifications are straightforward and are similar to those discussed in Section I.

IIa. Reduction of Power Supply Fluctuations

Figure 12:
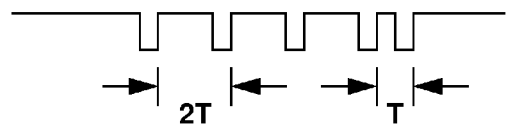
FIG. 12 illustrates one approach to slow down some clock cycles in a clock burst.

A long clock burst may induce power supply fluctuations. Performing the write and read operations in different clock bursts allows for reduction of the number of at-speed clock cycles in a clock burst and thus for reduction of the power supply fluctuations. FIG. 12 shows a clock burst with five clock cycles where the first three clock cycles have been slowed down such that the instantaneous frequency is half of that for the last two clock cycles. Clock cycles may be slowed down by any amount as needed. The logic in the fan-in and fan-out of the memory is tested at-speed as long as the last two cycles of the write and read clock bursts are at speed. More specifically, the timing critical operations of the write clock burst occur from the clock edge initiating step b (i.e. writing D1 at address A1 and launching final address A2 and data D2) and the clock edge initiating step c (i.e. writing D2 at address A2). Similarly, the timing critical operations of the read clock burst occur from the clock edge initiating step e (i.e. reading D2 at address A2) and the clock edge initiating step f (i.e. capture). These timing critical operations are shown to be at the end of the clock burst but this is not mandatory. Clock cycles following the timing critical operations could be slowed down. Clock bursts can be generated by using the circuits described in Patent '669 and U.S. Pat. No. 7,155,651 (Patent '651) or any other suitable circuits.

Figure 10:
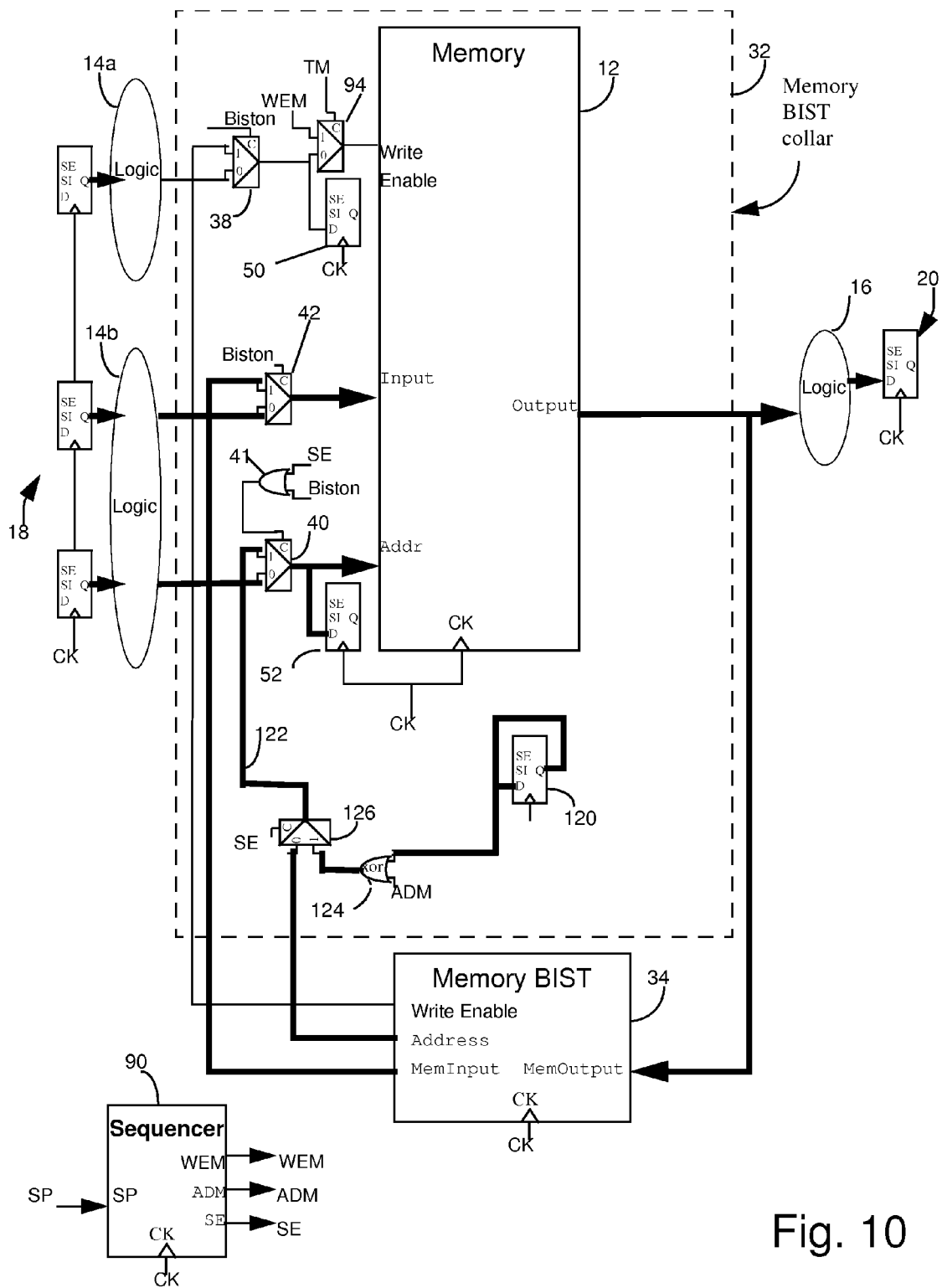
FIG. 10 is circuit diagram of a test interface that can perform the write and read operations in different clock bursts according to various embodiments of the present invention.

FIG. 10 illustrates a test interface circuit 32 to a single-port memory 12 that can perform the write and read operations in different bursts. Typically, the test interface includes support for memory Built-In Self-Test (BIST) although this is not essential to the invention. Multiplexers 38, 42 and 126 are used exclusively for memory BIST and operate in similar ways as described previously. Address register 120 includes scannable flip-flops which hold a reference address determining where the initialization and final data words are written in memory. In this embodiment of the invention, the final data word is written at the reference address and the initialization data word is written at an address derived from the reference by inverting at least one of its bits using XOR gate 124. Control signal ADM (address mask) determines which bit(s) of the reference address is (are) inverted when set to its active value, which is 1 in this embodiment. The reference address is transferred without modification to the output of XOR 124 when ADM is set to its inactive value 0. Multiplexer 126 selects between the output of XOR 124 and the memory BIST address. The control input of multiplexer 126 is SE (Scan enable). SE is combined with another control signal Biston using OR gate 41. The output of OR gate 41 selects between the output of multiplexer 126 and the output of functional logic circuit 14b. When signal SE is set to its active value 1, the output of XOR 124 is applied to the address input of memory 12 through multiplexer 126 and 40. Finally, multiplexer 94 selects between the output of multiplexer 38 and control signal WEM (write enable mask) which configures the memory into write and read mode according to a sequence described later. The control input of multiplexer 94 is TM. TM is set to its active value 1 during the entire duration of the test making the output of multiplexer 38 unobservable. Therefore, observation flip-flop 50 is added to make multiplexer 38 and all logic in its fan-in testable, including functional logic circuit 14a. Similarly, observation flip-flop 52 is needed to make multiplexer 40 and all logic in its fan-in testable, including the portion of functional logic circuit 14b generating the memory address during the normal mode of operation of the circuit. Control signals WEM, ADM and SE are generated by sequencer 90 which is clocked by the same clock signal CK that clocks the memory. The SE signal is also connected to the SE input of scannable flip-flops.

IIb. Multi-Port Memories

Figure 13:
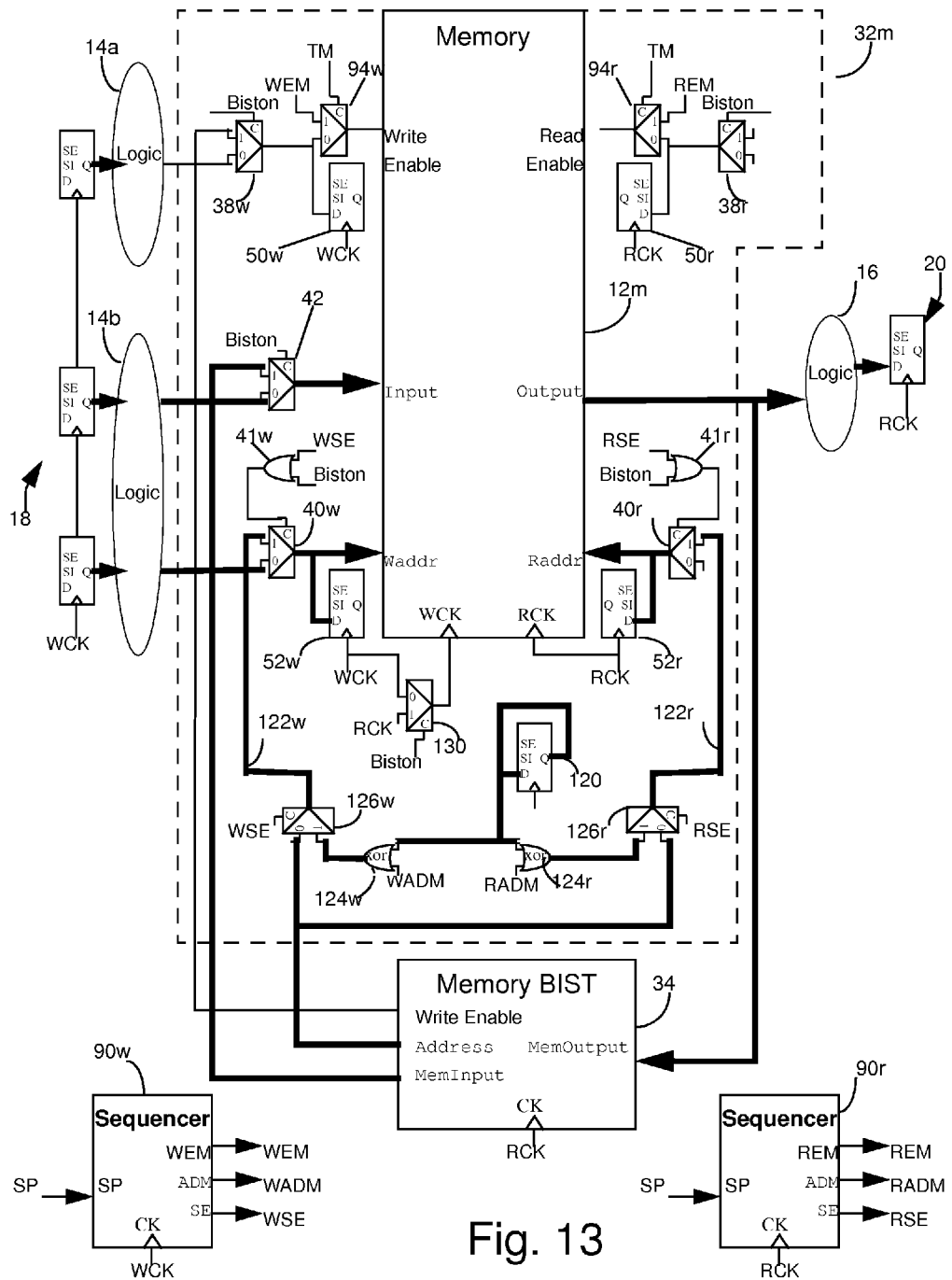
FIG. 13 is circuit diagram of a test interface having a write clock signal and a read clock signal according to various embodiments of the present invention.

Performing the write and read operations in different clock bursts also enables testing of multi-port memories with asynchronous clocks. FIG. 13 illustrates a test interface circuit 32m to a multi-port memory 12m that can be used to implement various methods of the present invention. The memory itself has a read port whose clock input RCK connected to a clock signal of the same name. The write port has a clock input WCK connected to the output of multiplexer 130 selecting between two clock signals called WCK and RCK. Multiplexer 130 is only necessary to support memory BIST. When executing memory BIST, multiplexer 130 selects clock signal RCK so that all ports of the memory operate synchronously with memory BIST controller 34. However, during the functional mode of operation of the circuit and when testing the logic around the memory using asynchronous clocks, clock signal WCK is selected to be applied to the memory write clock input WCK. Multiplexers 38w, 38r, 42, 126w and 126r have the same function as the multiplexers with the same numeral in FIG. 10 and are only used for memory BIST purposes. The "w" and "r" suffixes indicate that the multiplexer is associated to the write and read port respectively of the memory. The same convention is used for XOR gates 124w and 124r, OR gates 41w and 41r, multiplexers 94w and 94r, observation flip-flops 50w, 50r, 52w and 52r. Observation flip-flops 50w and 52w are clocked with clock signal WCK to enable at-speed testing of multiplexers 38w, 40w and all logic in their fan-in. Similarly observation flip-flops 50r and 52r are clocked with clock signal RCK to enable at-speed testing of multiplexers 38r, 40r and all logic in their fan-in. Control signals WADM and RADM are similar to control signal ADM of FIG. 10. However, the circuit generating WADM, sequencer 90w, is clocked by clock signal WCK while the circuit generating RADM, sequencer 90r, is clocked by clock signal RCK. This is to make sure that the write test address is applied synchronously to the write address input of the memory and that the read test address is applied synchronously to the read address input of the memory. Control signal WEM is essentially the same as control signal WEM of FIG. 10. Control signal REM (Read enable mask) is connected to the read enable input of memory 12m during the test to control read operations. Control signals WSE and RSE are similar to control signal SE of FIG. 10. Again here, the only difference is that they are associated to different clock signals, WCK and RCK respectively. In general, a sequencer is needed for each clock signal. Address register 120 can be clocked by the WCK or the RCK clock signal since it is holding the reference address for the entire duration of the write and read burst phases and does not generate any timing critical signal.

Figure 14:
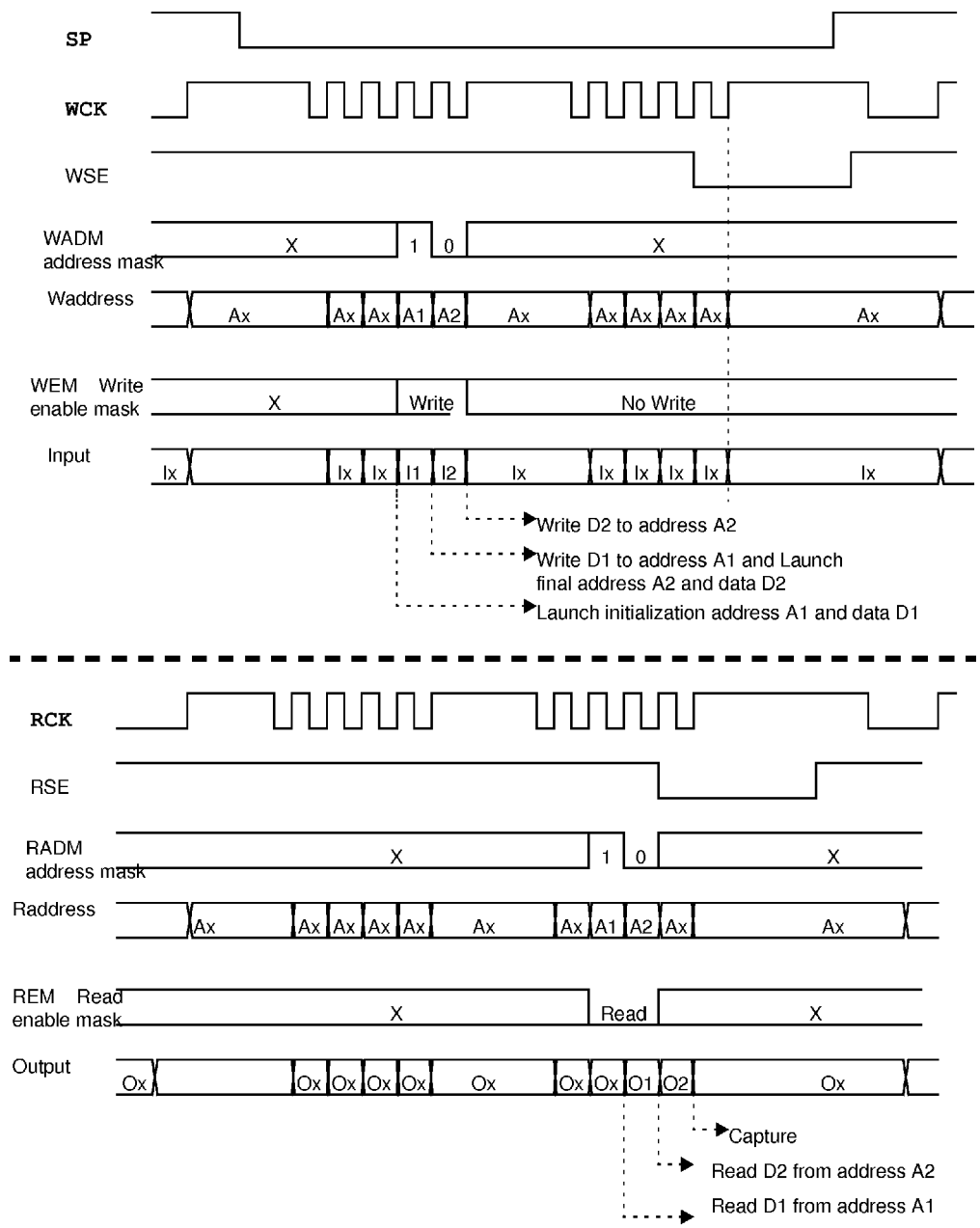
FIG. 14 is a timing diagram illustrating signal waveforms according to various embodiments in which the write and read operations use separate clock signals and are performed in different clock bursts.

The sequence of events for the circuit of FIG. 13 is essentially the same as the one described for the circuit of FIG. 10 and the corresponding timing diagram is shown in FIG. 14. Two clock bursts are applied to both WCK and RCK even though it would not be necessary for the simple multi-port memory shown in FIG. 13. The write port does not perform any useful operation during the second clock burst applied to WCK and the read port does not perform any useful operation during the first clock burst applied to RCK. However, a same clock signal could be used to control a mixture of read and write ports. For example, the write port of memory 32m could be replaced by a port with both read and write capability. In this case, operations would be performed on that port during both WCK clock bursts. In another example, a second memory identical to 32m is added to the circuit but the clock input of the read port is connected to WCK and the clock input of the write port is connected to RCK.

Figure 3:
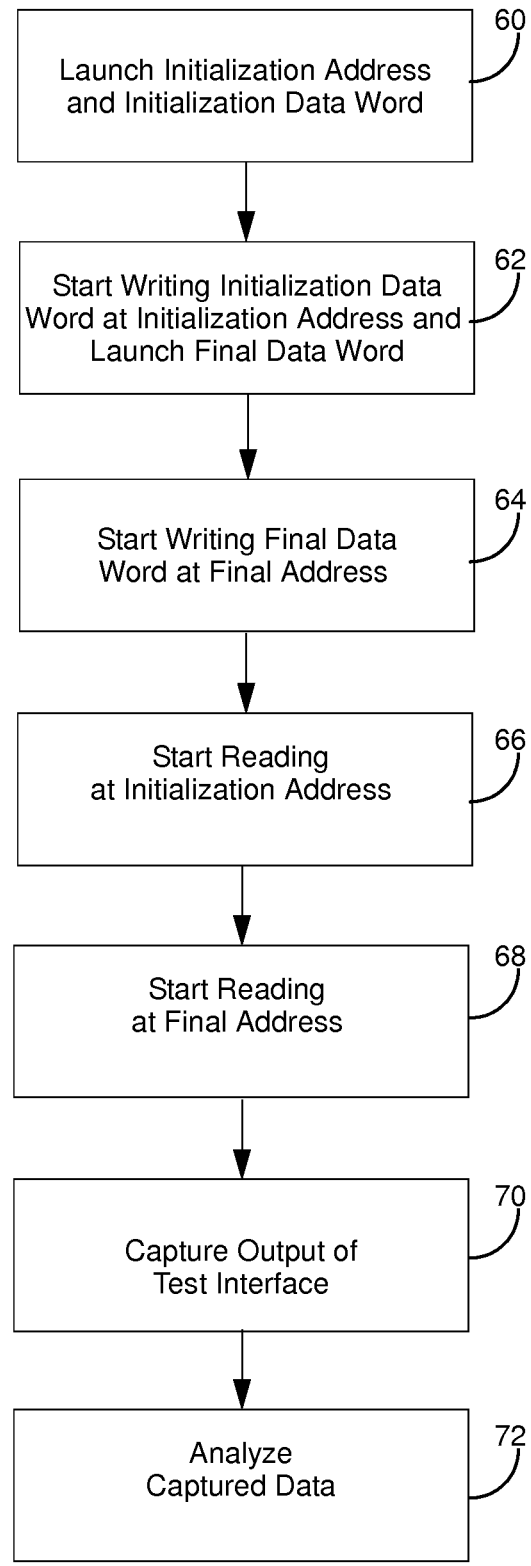
FIG. 3 is a flow diagram illustrating the operations performed according to the present invention.

The clock bursts must be generated in a way that there is no possible overlap between the first clock burst of a clock signal and the second clock burst of another clock signal. This is because the sequence of events described earlier might not be implemented correctly. For example, if the second burst of clock RCK is initiated before the end of the first burst of clock WCK, the final data word D2 at memory address A2 might not be written before there is an attempt to read it. In order to avoid such an incorrect sequence of events, it is preferable to make sure that the second clock burst is not initiated on any clock signal before the first clock burst has been completed for all other clock signals. For example, a slight modification of the shift clock controller described in Patent '651 could be used. Referring to FIG. 3 of Patent '651, Burst state 70 and BurstPause 72 are repeated before branching back to Shift state 66. The shift clock controller generates a control signal at the beginning of each Burst state to initiate a clock burst for all clock signals. The Burst state is sufficiently long for all clock signals to complete their first burst. This time can be quite variable since each clock signal can have a different frequency and a different number of slowed down clock cycles. The BurstPause state is chosen to be long enough to account for the difference in delay between the shift clock controller and the various clock controllers distributed throughout the circuit.

The test interface of FIG. 13 can be simplified if a single clock signal is used to control the clock inputs of the write and read ports of memory 12m, flip-flops 18 and 20 and memory BIST controller 34 or if WCK and RCK are synchronous clocks. When all ports operate synchronously, the same test address can then be used as an input to multiplexers 40w and 40r. So, only one of XOR gate 124w and 124r is required and only one of multiplexer 126w and 126r is required to generate test address 122w and 122r respectively. Only one of signal WADM and RADM need to be generated as an address mask. Only one of WSE and RSE need to be generated as a Scan Enable. Finally, multiplexer 130 is no longer required.

If memory 12m has multiple synchronous read ports, those can also share the same control signal REM. In addition to reducing the complexity of the test interface, it allows concurrently reading final data word D2 at memory address A2. This action provides an excellent stability test for the memory cells of multi-port memories with multiple read ports.

Figure 15:
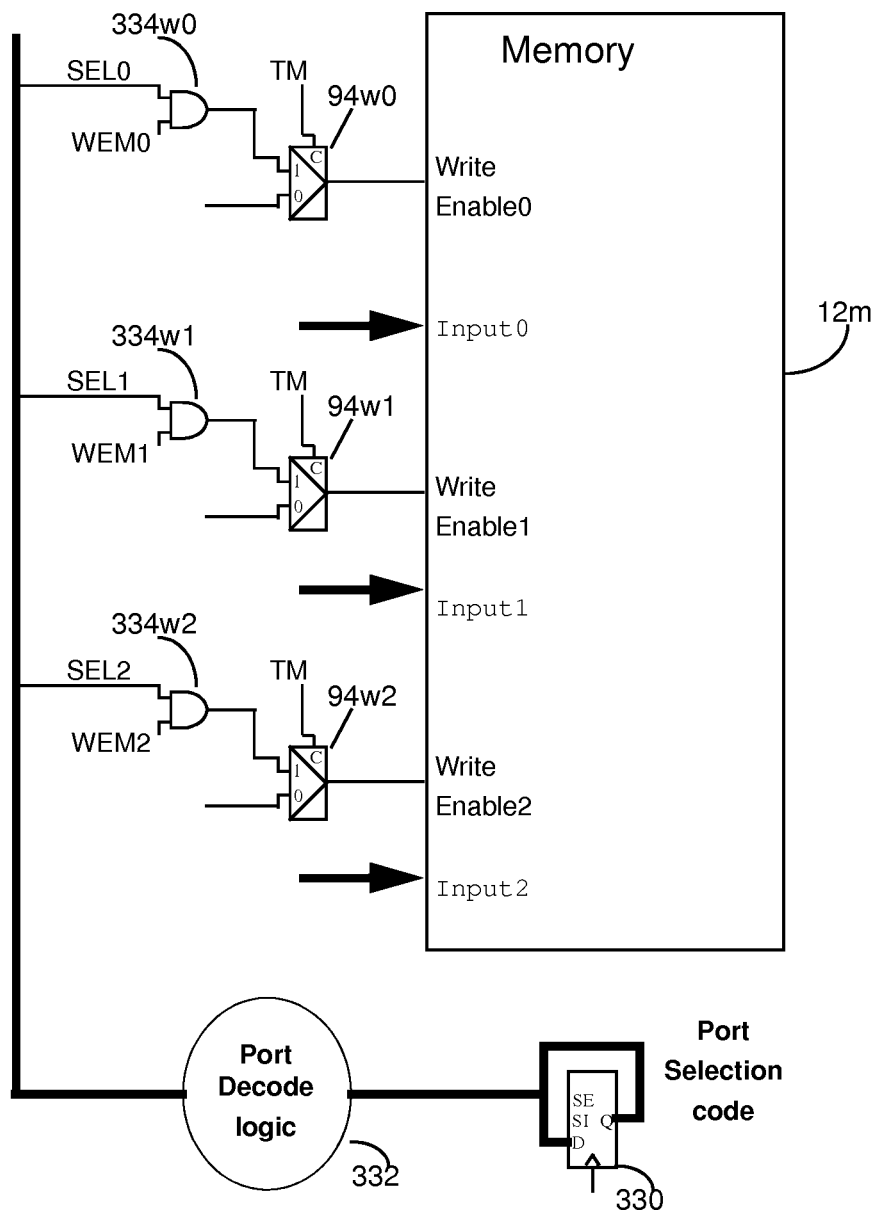
FIG. 15 is circuit diagram of a portion of a test interface in which the memory has multiple write ports and a decode logic according to various embodiments of the present invention.

Memories with multiple write ports may need an enhancement to their test interface to prevent writing data to the same memory address from different write ports. Memory 12m of FIG. 15 has three write ports which can operate synchronously or asynchronously. Each write port has a Write Enable input (Write Enable0 to Write Enable2) and a data input (Input0 to Input2). Only the new connections to the Write Enable inputs are shown. As for previous embodiments, control signal TM is set to 1 during the scan test so that multiplexers 94w0 to 94w2 select the output of AND gates 334w0 to 334w2. Write Enable Mask signals WEM0 to WEM2 are generated as shown in FIG. 14 for each write port. As explained earlier, signals WEM0 to WEM2 are generated by different sequencers if the write ports are asynchronous or by a same sequencer if the write ports are synchronous. Signals WEM0 to WEM2 are gated with write port select signals SEL0 to SEL2 generated by decode logic 332. Decode logic 332 is arranged to select one and only one write port to perform write operations during the first clock burst. The write port is selected by scanning a selection code in register 330 during the shift phase. Register 330 holds the selection code during the clock bursts so that register 330 and decode logic 332 can be shared by all write ports without creating any critical timing paths.

Figure 16:
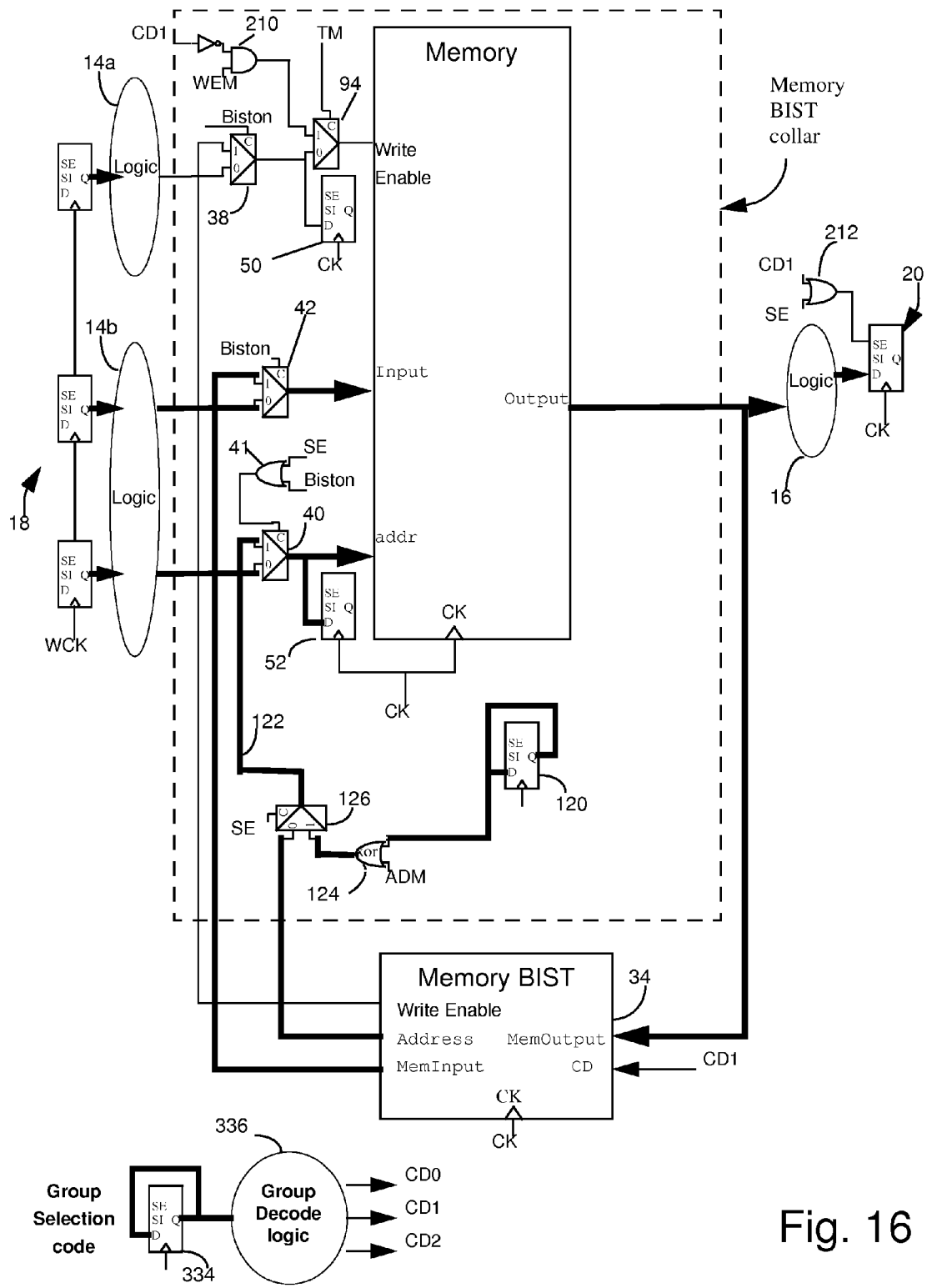
FIG. 16 is circuit diagram of a test interface that can suppress the capture operation based on the memory output according to various embodiments of the present invention.

Sometimes, it is not possible to successfully propagate an initialization and final data word through the memory. A mechanism may be needed to prevent the propagation of unknown values to flip-flops in the fan-out of the memory. FIG. 16 shows a Capture Disable signal CD1 connected to the input of OR gate 212 for such a purpose. The other input of OR gate 212 is Scan Enable signal SE. The output of OR gate 212 is connected to Scan Enable SE input of flip-flop 20. This input configures the flip-flop in shift mode when set to 1 and in capture mode when set to 0. Referring back to the timing diagram of FIG. 11, signal SE will force all scannable flip-flops in shift mode during all clock cycles of the write and read clock bursts except for the very last cycle of the read clock burst where most flip-flops are allowed to capture. However, if the memory output is unknown, this capture operation should be suppressed for flip-flops in the fan-out of the memory such as flip-flop 20. This is done by forcing signal CD1 to 1 which will force those flip-flops to remain configured in shift mode, preventing unknown values to be captured. Signal CD1 is also used by scannable flip-flops in memory BIST circuit 34, if applicable. Signal CD1 is also used to suppress write operations to the memory during the write clock burst to minimize power and eliminate possible timing hazards during simulation. Signal CD1 is generated by Group Decode logic 336 whose input is connected to a Group Selection Code register 334. In this example, Group Decode logic 334 generates three control signals CD0 to CD2 and is arranged to set all CD signals to 1 except one which is set to 0. This arrangement can be used in a circuit that has three groups of memories and where only one group is allowed to perform operations at any given time to reduce power consumption, for example. Each memory group is associated to a Group Selection code which is scanned in at the same time as all other scannable flip-flops of the circuit in register 334. Register 334 holds the Group Selection code during the clock bursts so that register 334 and decode logic 336 can be shared by all memories without creating any critical timing paths.

For small memories, it is possible to test faults in the address decoding logic of the memory without a memory BIST circuit. This is done by slightly modifying the sequence of operations during the second clock burst. The modified sequence includes inverting d and e of the original sequence as follows:

d. Read final data word D2 at memory address A2.
    e. Read initialization data word D1 at memory address A1.
    f. Perform capture operation on scannable flip-flops.

Inverting the memory read address sequence allows detecting address decoder stuck-open faults that would cause a corruption of initialization data word D1 at memory address A1 when writing final data word D2 at memory address A2 during the write clock burst. The modified sequence is easy to implement in hardware with only a slight change to the generation of the address mask signal. However, a more complex memory model may be needed since the memory no longer looks like a simple fixed length pipeline register.

IIc. Memories with a Write-All Input

When a memory allows writing all its addresses in a single operation, it is possible to detect defects in the functional logic without using additional observation flip-flops. One example of such a memory is shown in Hui and Nadeau-Dostie, "Scan Testing Of Latch Arrays," IEEE VLSI Test Symposium 1992, 31-36, which is incorporated herein by reference. Removing the observation flip-flops not only reduces test-dedicated circuitry but may also allow testing the functional logic using the same timing as the one used during the normal mode of operation.

Figure 17:
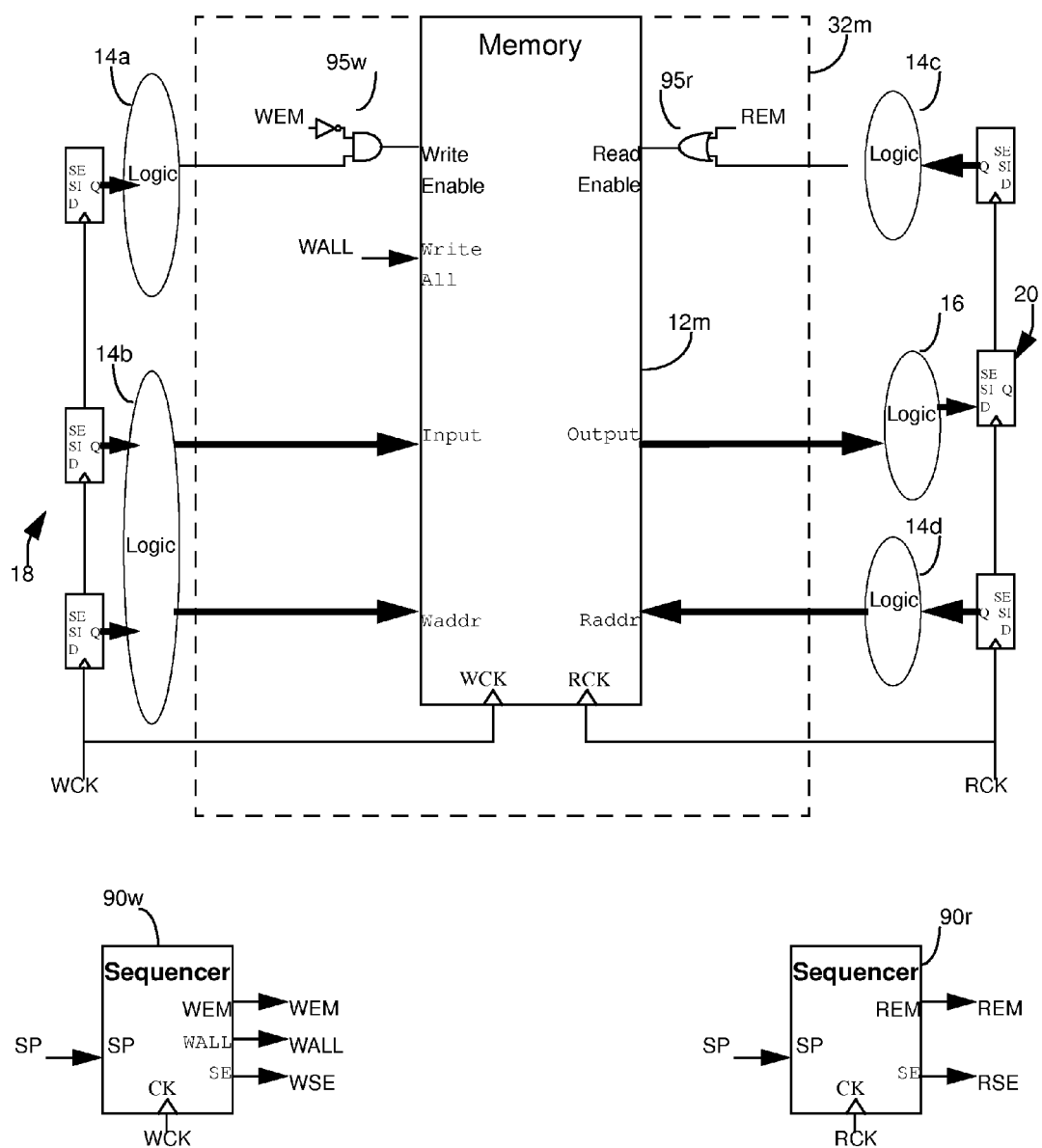
FIG. 17 is circuit diagram of a test interface in which the memory has a write all input according to various embodiments of the present invention.

FIG. 17 shows a simplified test interface for memory 32m having an additional input named Write All. This Write All input allows writing all memory address locations when set to its active value, which is 1 in this example. When it is inactive, the memory behaves in the usual way i.e. a single address location is written if Write Enable is set to its active value, which is also 1 in this example. When both Write Enable and Write All are inactive, no address location is written. The Write All input is normally used for testing purposes and is driven directly by sequencer 90w in the figure. The Write Enable input signal is generated by gating logic 95w which uses the WEM signal to enable writing to the memory during specific cycles of the write burst. The WEM signal is also generated by sequencer 90w. Gating logic 95r enables reading the memory during specific cycles of the read burst and is generated by sequencer 90r. Gating logic 95r and signal REM are not necessary if the memory does not have a Read Enable signal or the functional Read Enable is always active i.e. if the output of functional logic circuit 14c generating the functional Read Enable signal is always 1. As explained earlier, WCK and RCK could be the same clock or could operate synchronously so that a single sequencer could be used to generate the control signals.

Figure 18:
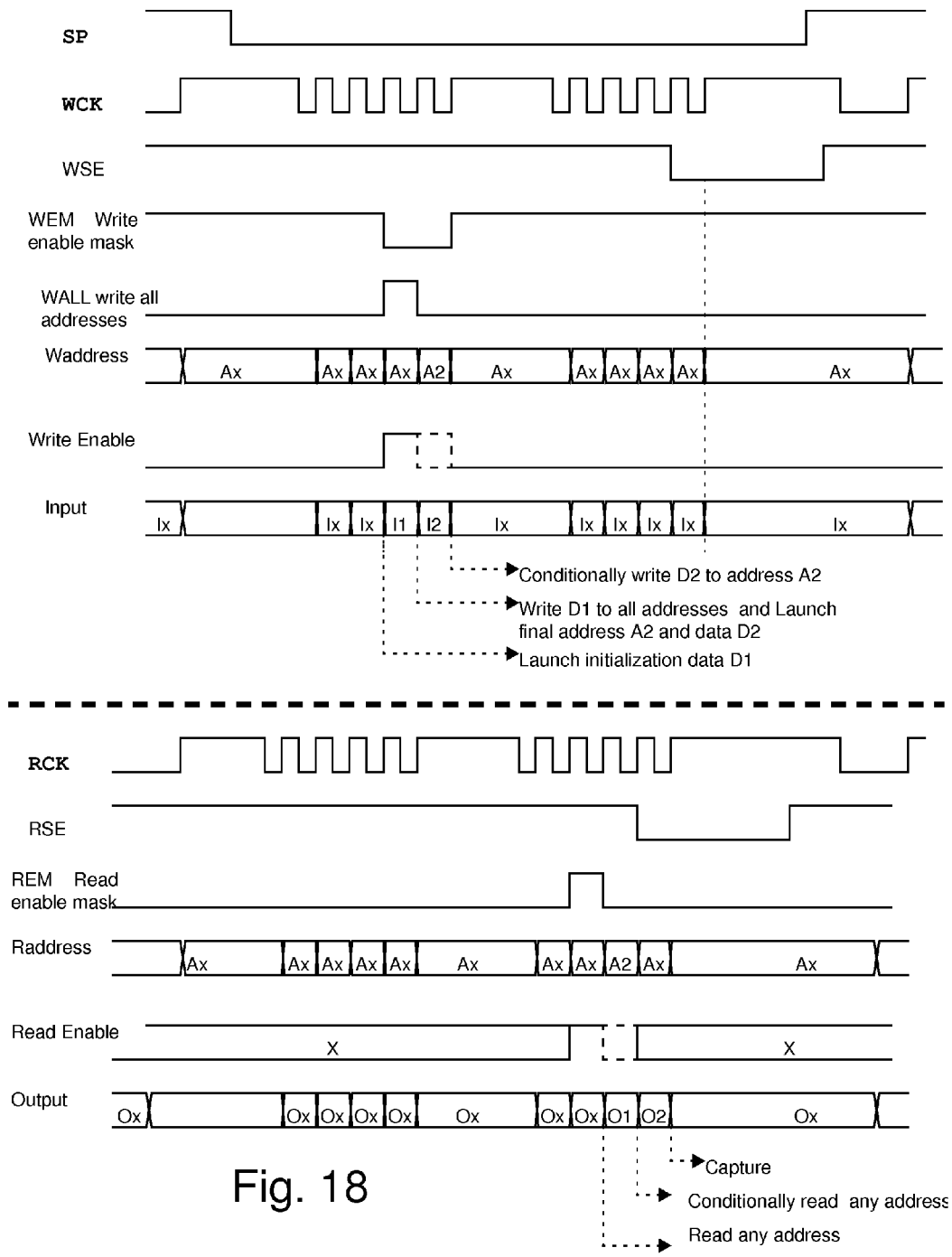
FIG. 18 is a timing diagram illustrating signal waveforms according to various embodiments in which a write all operation is performed.

FIG. 18 shows a timing diagram for the circuit of FIG. 17 during the test mode. The sequence of events is similar to the one shown in FIG. 11. Operations a to c of the write burst are modified as follows:

a. Launch initialization data word D1 from flip-flops in the fan-in of the memory.
    b. Write initialization data word D1 to all memory addresses and, launch final data word D2 and final address A2.
    c. Conditionally write final data word D2 at memory address A2.

The main difference between the two sequences shown in FIGS. 18 and 11 is in operation a: the initialization data word D1 is written to all memory locations instead of a single location. Another important difference is that memory address A2 is generated using functional logic instead of a reference address register. Operation c is conditional to the output value of functional logic circuit 14a generating the functional Write Enable signal. This is why the Write Enable waveform shows that its value could be a 1 or a 0 during that step.

Operations d to f of the read burst are modified as follows:

d. Read at a first memory address.
    e. Conditionally read at a second memory address.
    f. Perform capture operation on scannable flip-flops.

In operation d, the read operation is unconditional to make sure that the memory output has a defined value. Control signal REM is used to force the Read Enable input of the memory to 1 only if necessary. As explained before, there might be no Read Enable input or the functional Read Enable signal could always be active. In operation e, the read operation is conditional to the output value of functional logic circuit 14c, if it exists. This is why the Read Enable waveform shows that its value could be a 1 or a 0 during that operation.

The first and second memory addresses are provided by the scan chain 18. They may be specified or randomly generated. For operation d and e, the memory output will take data value D2 if address A2 is read or data value D1 if any other address is read. All four combinations are possible at the memory output if the test pattern is generated randomly by a memory BIST (not shown in FIG. 17): D1 followed by D2, D2 followed by D1, D1 followed by D1 and D2 followed by D2. Transition faults of functional logic 16 are better tested using the first two combinations.

A useful variation of the sequence is to slightly modify the write burst to write additional memory addresses with some data words. By doing so, the testability is improved because the probability of reading a memory address with a data word different than the initialization data word during the read burst increases. One trade-off is that paths in the fan-in of the memory might not be exercised at-speed if some clock cycles need to be slowed down. The modified sequence simply repeats operation b for an arbitrary number of memory addresses which is limited by the number of clock cycles in the burst and includes the following operations:

a. Launch initialization data word D1 from flip-flops in the fan-in of the memory.
    b1. Write initialization data word D1 to all memory addresses and, launch data word D2 and address A2.
    b2. Write data word D2 at memory address A2 and launch final data word D3 and address A3.
    . . .
    bn. Write data word Dn at memory address An and launch final data word Dn+1 and address An+1.

c. Conditionally write final data word Dn+1 at memory address An+1.

In some cases where WCK and RCK are connected to the same clock source or are synchronous and asynchronous write-thru operations are allowed by the embedded memory, it is possible to perform some of the operations concurrently. Specifically, operations b and d can be performed concurrently as well as operations c and e. This means that all write and read operations can be used using a single clock burst. In the case of the modified sequence allowing multiple addresses to be written with a final data word, operations bn and d would be performed concurrently.

Conclusion

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims.

What is claimed is:

1. A method for testing a memory interface at-speed, comprising:
    scanning in input data;
    performing one or more write operations on a memory using the input data during a first clock burst, the memory being associated with the memory interface being tested;
    performing one or more read operations on the memory during a second clock burst, the one or more read operations starting after the one or more write operations are completed;
    capturing output data from the memory interface with scannable memory elements during the second clock burst, the output data corresponding to the one or more read operations; and
    scanning out the output data from the scannable memory elements.

2. The method recited in claim 1, wherein the first clock burst precedes the second clock burst in a same clock signal.

3. The method recited in claim 1, wherein the first clock burst and the second clock burst are in separate clock signals.

4. The method recited in claim 1, wherein the capturing can be suppressed when the memory interface outputs unknown values.

5. The method recited in claim 1, wherein the input data include, if the memory has a plurality of write ports, a write port selection code for selecting a write port from the plurality of write ports to perform the one or more write operations during the first clock burst.

6. The method recited in claim 1, wherein one or more clock cycles in the first clock burst, the second clock burst or both run at a slower frequency than the other clock cycles in the same clock burst.

7. The method recited in claim 1, further comprising:
    launching initialization information before the one or more write operations, the initialization information being included in or derived from the input data.

8. The method recited in claim 7, wherein the initialization information comprises an initialization address and an initialization data word.

9. The method recited in claim 8, wherein the one or more write operations comprises:
    writing the initialization data word to a first memory location corresponding to the initialization address; and
    writing a final data word to a second memory location corresponding to a final address.

10. The method recited in claim 9, wherein the initialization address and the final address are derived using a reference address, the reference address being included in the input data and stored in an address register.

11. The method recited in claim 9, wherein the one or more read operations comprise:
    reading the initialization data word from the first memory location corresponding to the initialization address; and
    reading the final data word from the second memory location corresponding to the final address.

12. The method recited in claim 9, wherein the one or more read operations comprise:
    reading the final data word from the second memory location corresponding to the final address; and
    reading the initialization data word from the first memory location corresponding to the initialization address.

13. The method recited in claim 7, wherein the initialization information comprises an initialization data word.

14. The method recited in claim 13, wherein the one or more write operations comprises:
    writing the initialization data word to all memory locations; and
    if a write enable signal is active, writing one or more final data words to one or more memory locations.

15. The method recited in claim 14, wherein the one or more read operations comprise:
    reading from a first memory location corresponding to a first address; and
    if a read enable signal is active, reading from a second memory location corresponding to a second address.

16. A circuit, comprising:
    a memory;
    a memory interface associated with the memory; and
    a plurality of scannable memory elements configured at least to scan in data for performing a method for testing the memory interface at-speed, the method comprising:
    scanning in input data;
    performing one or more write operations on the memory using the input data during a first clock burst;
    performing one or more read operations on the memory during a second clock burst, the one or more read operations starting after the one or more write operations are completed;
    capturing output data from the memory interface during the second clock burst, the output data corresponding to the one or more read operations; and
    scanning out the output data.

17. The circuit recited in claim 16, further comprising:
    a sequencer configured to generate control signals for each clock signal.

18. The circuit recited in claim 16, wherein the first clock burst precedes the second clock burst in a same clock signal.

19. The circuit recited in claim 16, wherein the first clock burst and the second clock burst are in separate clock signals.

20. The circuit recited in claim 16, wherein the capturing can be suppressed when the memory interface outputs unknown values.

21. The circuit recited in claim 16, wherein the input data include, if the memory has a plurality of write ports, a write port selection code for selecting a write port from the plurality of write ports to perform the one or more write operations during the first clock burst.

22. The circuit recited in claim 16, wherein one or more clock cycles in the first clock burst, the second clock burst or both run at a slower frequency than the other clock cycles in the same clock burst.

23. The circuit recited in claim 16, wherein the method further comprising:
    launching initialization information before the one or more write operations, the initialization information being included in or derived from the input data.

24. The circuit recited in claim 23, wherein the initialization information comprises an initialization address and an initialization data word.

25. The circuit recited in claim 24, wherein the one or more write operations comprises:
    writing the initialization data word to a first memory location corresponding to the initialization address; and
    writing a final data word to a second memory location corresponding to a final address.

26. The circuit recited in claim 25, wherein the initialization address and the final address are derived using a reference address, the reference address being included in the input data and stored in an address register.

27. The circuit recited in claim 25, wherein the one or more read operations comprise:
    reading the initialization data word from the first memory location corresponding to the initialization address; and
    reading the final data word from the second memory location corresponding to the final address.

28. The circuit recited in claim 25, wherein the one or more read operations comprise:
    reading the final data word from the second memory location corresponding to the final address; and
    reading the initialization data word from the first memory location corresponding to the initialization address.

29. The circuit recited in claim 23, wherein the initialization information comprises an initialization data word.

30. The circuit recited in claim 29, wherein the one or more write operations comprises:
    writing the initialization data word to all memory locations; and
    if a write enable signal is active, writing one or more final data words to one or more memory locations.

31. The circuit recited in claim 30, wherein the one or more read operations comprise:
    reading from a first memory location corresponding to a first address; and
    if a read enable signal is active, reading from a second memory location corresponding to a second address.

* * * * *